United States Patent
Kawasoe et al.

(10) Patent No.: US 11,070,352 B2
(45) Date of Patent: Jul. 20, 2021

(54) CDR CIRCUIT AND RECEIVER OF MULTILEVEL MODULATION METHOD

(71) Applicant: FUJITSU LIMITED, Kawasaki (JP)

(72) Inventors: Nobuaki Kawasoe, Yokohama (JP); Yoshiharu Yoshizawa, Kawasaki (JP); Manabu Yamazaki, Fuchu (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 17/004,052

(22) Filed: Aug. 27, 2020

(65) Prior Publication Data

US 2021/0067312 A1 Mar. 4, 2021

(30) Foreign Application Priority Data

Sep. 4, 2019 (JP) .............................. JP2019-161458

(51) Int. Cl.
*H04L 7/02* (2006.01)
*H03L 7/091* (2006.01)
*H03L 7/08* (2006.01)
*H04L 7/04* (2006.01)

(52) U.S. Cl.
CPC .............. *H04L 7/02* (2013.01); *H03L 7/0807* (2013.01); *H03L 7/091* (2013.01)

(58) Field of Classification Search
CPC ................................... H04L 7/02; H04L 7/04
USPC ..................................................... 327/12, 141
See application file for complete search history.

(56) References Cited

U.S. PATENT DOCUMENTS

| | | | | |
|---|---|---|---|---|
| 8,698,528 B2* | 4/2014 | Shibasaki | ............. | H03L 7/0814 327/158 |
| 8,791,735 B1* | 7/2014 | Shibasaki | ......... | H04L 25/03057 327/156 |
| 10,103,870 B2* | 10/2018 | Shibasaki | ............... | H03L 7/085 |
| 2018/0241540 A1 | 8/2018 | Shibasaki | | |

FOREIGN PATENT DOCUMENTS

JP 2018-137551 A 8/2018

* cited by examiner

*Primary Examiner* — Hai L Nguyen
(74) *Attorney, Agent, or Firm* — Fujitsu Patent Center

(57) ABSTRACT

A clock data recovery circuit includes a circuit that receives a data signal for which each of a plurality of potential levels is associated with a value of 2 bits or more, based on a result of a first comparison that compares the 3 or more first thresholds with the data signal at timing synchronized with a clock signal; a circuit that outputs a result of a second comparison that compares the data signal with a second threshold at the timing; a circuit that generates a phase difference signal indicating whether to advance or delay a phase of the clock signal, based on the result of the determination and the result of the second comparison; a filter that generates a phase adjusted value indicating an adjustment amount of the phase, based on the phase difference signal; and a circuit that adjusts the phase based on the phase adjusted value.

8 Claims, 28 Drawing Sheets

FIG. 6

<PERFORM PHASE DIFFERENCE DETECTION ON 8/16 CONDITIONS>

| Do[0] | Do[1] | Do[2] | PL[1] | PH[1] | UP/DN |
|---|---|---|---|---|---|
| ~~0~~ | ~~1~~ | ~~2~~ | ~~0~~ | ~~x~~ | ~~DN~~ |
| 0 | 1 | 2 | 1 | x | UP |
| ~~0~~ | ~~1~~ | ~~3~~ | ~~0~~ | ~~x~~ | ~~DN~~ |
| 0 | 1 | 3 | 1 | x | UP |
| 0 | 2 | 3 | x | 0 | DN |
| ~~0~~ | ~~2~~ | ~~3~~ | ~~x~~ | ~~1~~ | ~~UP~~ |
| 1 | 2 | 3 | x | 0 | DN |
| ~~1~~ | ~~2~~ | ~~3~~ | ~~x~~ | ~~1~~ | ~~UP~~ |
| 2 | 1 | 0 | 1 | x | DN |
| ~~2~~ | ~~1~~ | ~~0~~ | ~~0~~ | ~~x~~ | ~~UP~~ |
| 3 | 1 | 0 | 1 | x | DN |
| ~~3~~ | ~~1~~ | ~~0~~ | ~~0~~ | ~~x~~ | ~~UP~~ |
| ~~3~~ | ~~2~~ | ~~0~~ | ~~x~~ | ~~1~~ | ~~DN~~ |
| 3 | 2 | 0 | x | 0 | UP |
| ~~3~~ | ~~2~~ | ~~1~~ | ~~x~~ | ~~1~~ | ~~DN~~ |
| 3 | 2 | 1 | x | 0 | UP |

FIG. 8

<PERFORM PHASE DIFFERENCE DETECTION ON 2/16 CONDITIONS>

| Do[0] | Do[1] | Do[2] | PL[1] | PH[1] | UP/DN |
|---|---|---|---|---|---|
| 0 | 1 | 2 | 0 | x | DN |
| 0 | 1 | 2 | 1 | x | UP |
| 0 | 1 | 3 | 0 | x | DN |
| 0 | 1 | 3 | 1 | x | UP |
| 0 | 2 | 3 | x | 0 | DN |
| 0 | 2 | 3 | x | 1 | UP |
| 1 | 2 | 3 | x | 0 | DN |
| 1 | 2 | 3 | x | 1 | UP |
| 2 | 1 | 0 | 1 | x | DN |
| 2 | 1 | 0 | 0 | x | UP |
| 3 | 1 | 0 | 1 | x | DN |
| 3 | 1 | 0 | 0 | x | UP |
| 3 | 2 | 0 | x | 1 | DN |
| 3 | 2 | 0 | x | 0 | UP |
| 3 | 2 | 1 | x | 1 | DN |
| 3 | 2 | 1 | x | 0 | UP |

FIG. 14

| PHASE DIFFERENCE DETECTION CONDITION | PHASE DIFFERENCE DETECTION RATE | ADJUSTMENT AMOUNT N | SENSITIVITY (SENSITIVITY CHANGE) |
|---|---|---|---|
| 16 CONDITIONS | 24/64=3x(16/2)/64 | 1 | 1 |
| 8 CONDITIONS | 12/64=3x(8.2)/64 | 2 | 0.5 → 1 |
| 4 CONDITIONS | 6/64=3x(4/2)/64 | 4 | 0.25 → 1 |
| 2 CONDITIONS | 3/64=3x(2/2)/64 | 8 | 0.125 → 1 |

CDR CIRCUIT AND RECEIVER OF MULTILEVEL MODULATION METHOD

CROSS-REFERENCE TO RELATED APPLICATION

This application is based upon and claims the benefit of priority of the prior Japanese Patent Application No. 2019-161458, filed on Sep. 4, 2019, the entire contents of which are incorporated herein by reference.

FIELD

The embodiments discussed herein are related to a clock data recovery (CDR) circuit and a receiver of a multilevel modulation method.

BACKGROUND

In recent years, as a technology to improve a data rate, there is proposed a multilevel transmission technology that adopts a multilevel modulation method such as a pulse-amplitude modulation 4 (PAM4).

In the meantime, in a receiver of an electric or optical transmission interface, CDR is performed that receives, on a transmission line, a signal for which a clock signal is superimposed on a data signal, and regenerates the clock signal from the data signal. To determine a value of the data signal at appropriate timing, CDR uses a phase detection circuit for detecting a phase difference between a phase at an eye center of an eye pattern by the data signal and a phase of a rising or falling edge of the clock signal.

If the multilevel transmission technology is applied to CDR, the number of thresholds to detect the phase difference described above or a value of the data signal is large, and the number of comparison circuits that compare those thresholds with the value of the data signal is large. When the number of the comparison circuits is large, power consumption increases due to an increase in a clock buffer of a path carried by the clock signal that drives each of the comparison circuits. The number of the comparison circuits may be reduced by reducing the number of the thresholds for detecting the phase difference and detecting a phase difference if particular data transition is detected. In that case, however, a probability of performing the phase difference detection (phase difference detection rate) decreases, deteriorating follow-up performance of a reception circuit with respect to a multivalued signal.

For example, Japanese Laid-open Patent Publication No. 2018-137551 is disclosed as the related art.

SUMMARY

According to an aspect of the embodiments, A clock data recovery (CDR) circuit includes a data determination circuit that receives a data signal for which each of a plurality of potential levels is associated with a value of 2 bits or more, the potential levels being separated by 3 or more first thresholds, and outputs a result of determination that determines a value of the data signal, based on a result of a first comparison that compares the 3 or more first thresholds with the data signal at timing synchronized with a clock signal; a comparison circuit that outputs a result of a second comparison that compares the data signal with a second threshold at the timing; a phase detection circuit that generates a phase difference signal indicating whether to advance or delay a phase of the clock signal, based on the result of the determination and the result of the second comparison, when a value of 3 consecutive symbols represents one data pattern that transits like a slope and when a combination of the value of the 3 symbols and the result of the second comparison at an intermediate symbol of the 3 symbols matches some prespecified combination of a plurality of combinations that the data pattern and the result of the second comparison at the intermediate symbol may take; a filter that generates a phase adjusted value indicating an adjustment amount of the phase, based on the phase difference signal; and a phase adjustment circuit that adjusts the phase based on the phase adjusted value.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is a diagram illustrating an example of 8 conditions of the 16 conditions on which the phase difference detection is performed;

FIG. 8 is a diagram illustrating an example of 2 conditions of the 16 conditions on which the phase difference detection is performed;

FIG. 14 is a diagram illustrating a relation of a phase difference detection condition and a sensitivity adjustment amount;

DESCRIPTION OF EMBODIMENTS

However, if a traditional CDR circuit is used that performs phase difference detection based on a data pattern in which a value of 3 consecutive symbols transits like a slope, it is likely that a phase difference is determined to be 0 although phases are not correctly adjusted, thus causing false lock.

In light of the foregoing, it is desirable to provide a CDR circuit and a receiver of a multilevel modulation method that suppress occurrence of false lock.

Embodiments of the present disclosure will be described below with reference to the drawings.

First Embodiment

Figure 1:
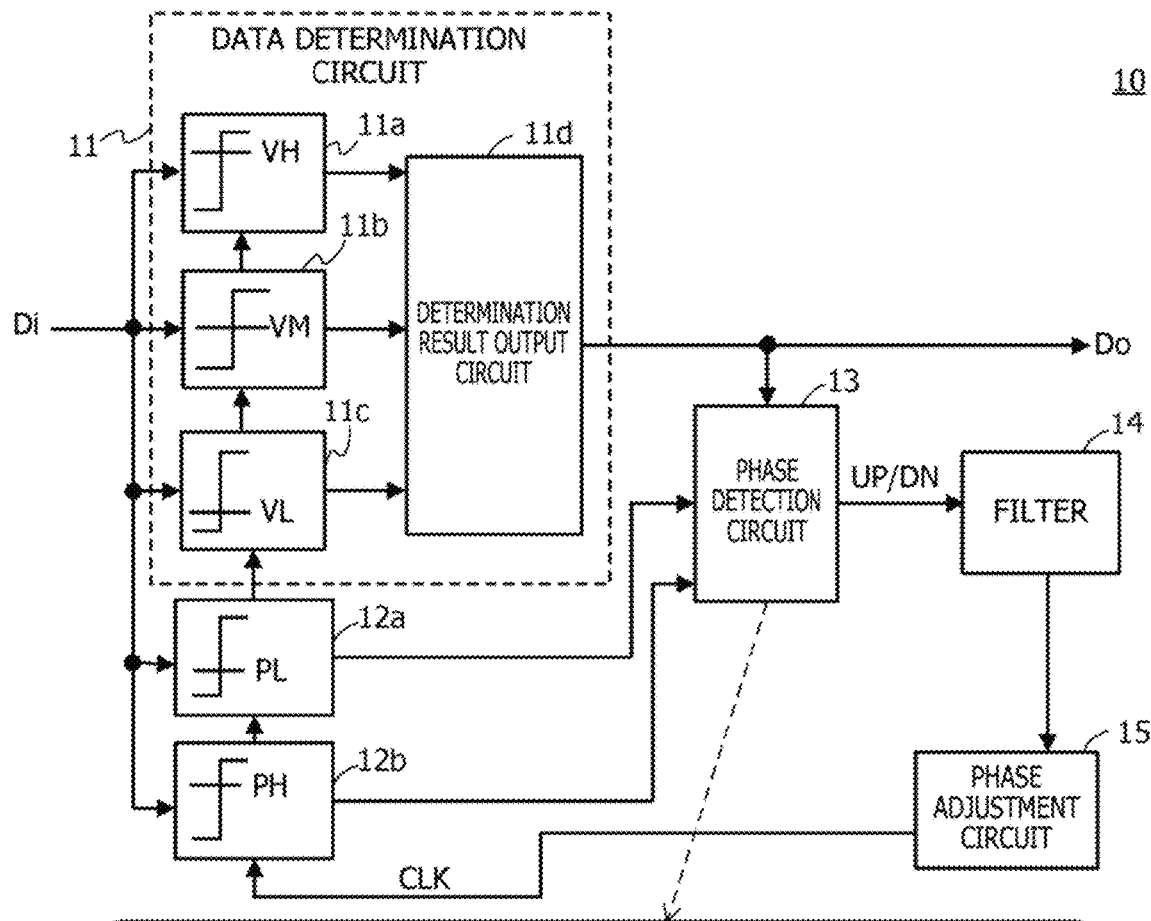
FIG. 1 illustrates an example of a CDR circuit of a first embodiment.

FIG. 1 is a diagram illustrating an example of a CDR circuit of a first embodiment.

A CDR circuit 10 of the first embodiment includes a data determination circuit 11, comparison circuits 12a and 12b, a phase detection circuit 13, a filter 14, and a phase adjustment circuit 15.

The data determination circuit 11 receives a data signal Di in which a value of 2 bits or more is associated with each of a plurality of potential levels separated by 3 or more thresholds. The data determination circuit 11 outputs a result Do of a determination that determines a value of the data signal Di, based on a result of a comparison that compares those thresholds with the data signal Di at timing synchronized with a clock signal CLK.

FIG. 1 illustrates an example of the data determination circuit 11 that determines the value of the data signal Di (data signal Di of PAM4) having a 2-bit value for each one symbol (1 unit Interval (UI)), using 3 thresholds VH, VM, and VL The data determination circuit 11 receives the data signal Di of PAM4 in which a 2-bit value ("00", "01", "10", or "11") is associated with each of 4 potential levels separated by the thresholds VH, VM, and VL, and outputs the determination result Do of the 2-bit value.

The threshold VM, a center of the 3 thresholds VL, VM, and VH, is a center of changes in amplitudes of the data signal Di, and is 0V, for example. If a voltage of the data signal Di changes from −1 to +1, the threshold VH is +⅔ and the threshold VL is −⅔, or the like.

The data determination circuit 11 has comparison circuits 11a, 11b, and 11c, and a determination result output circuit 11d.

The comparison circuit 11a outputs a result of a comparison of the data signal Di and the threshold VH. For example, when the data signal Di is larger than the threshold VH, the comparison circuit 11a outputs 1 (or a signal whose logical level is of H (High) level). When the data signal Di is smaller than the threshold VH, the comparison circuit 11a outputs 0 (or a signal whose logical level is of L (Low) level).

The comparison circuit 11b outputs a result of a comparison of the data signal Di and the threshold VM. For example, when the data signal Di is larger than the threshold VM, the comparison circuit 11b outputs 1 (or the signal whose logical level is of H (High) level). When the data signal Di is smaller than the threshold VM, the comparison circuit 11b outputs 0 (or the signal whose logical level is of L (Low) level).

The comparison circuit 11c outputs a result of a comparison of the data signal Di and the threshold VL. For example, when the data signal Di is larger than the threshold VL, the comparison circuit 11c outputs 1 (or the signal whose logical level is of H (High) level). When the data signal Di is smaller than the threshold VL, the comparison circuit 11c outputs 0 (or the signal whose logical level is of L (Low) level).

The determination result output circuit 11d outputs the 2-bit value of each symbol of the data signal Di, as the determination result Do, based on the comparison results outputted by the comparison circuits 11a to 11c. For example, if the comparison results outputted by the comparison circuits 11a to 11c are all "1", the determination result output circuit 11d outputs "11". If the comparison result outputted by the comparison circuit 11a is "0" and the comparison results outputted by the comparison circuits 11b and 11c are "1", the determination result output circuit 11d outputs "10". If the comparison results outputted by the comparison circuits 11a and 11b are "0" and the comparison result outputted by the comparison circuit 11c is "1", the determination result output circuit 11d outputs "01". If the comparison results outputted by the comparison circuits 11a to 11c are all "0", the determination result output circuit 11d outputs "00". In the following, the aforementioned 2-bit value may be referred to as decimals 0, 1, 2, 3 in ascending order.

A comparison circuit 12a outputs a result of a comparison that compares the data signal Di with a threshold PL at the timing synchronized with the clock signal CLK. The threshold PL is a threshold for phase difference determination and set to a value (voltage value) being intermediate in size between the threshold VM and the threshold VL, for example. When the data signal Di is larger than the threshold PL, for example, the comparison circuit 12a outputs 1 (or the signal whose logical level is of H (High) level). When the data signal Di is smaller than the threshold PL, the comparison circuit 12a outputs 0 (or the signal whose logical level is of L (Low) level).

A comparison circuit 12b outputs a result of a comparison that compares the data signal Di with a threshold PH at the timing synchronized with the clock signal CLK. The threshold PH is also the threshold for the phase difference determination and set to a value being intermediate in size between the threshold VM and the threshold VH, for example. When the data signal Di is larger than the threshold PH, for example, the comparison circuit 12b outputs 1 (or the signal whose logical level is of H (High) level). When the data signal Di is smaller than the threshold PH, the comparison circuit 12b outputs 0 (or the signal whose logical level is of L (Low) level).

Although the example of FIG. 1 illustrates the example in which the two comparison circuits 12a and 12b are provided, one of the two comparison circuits 12a and 12b may be omitted.

Based on the determination result outputted by the data determination circuit 11 and the comparison results outputted by the comparison circuits 12a and 12b, the phase detection circuit 13 generates a phase difference signal UP/DN if a situation to be described below occurs.

That situation is a data pattern in which a value of 3 consecutive symbols transit like a slope. The situation is such that a combination of the values of the 3 symbols and of the comparison results of the comparison circuits 12a and 12b at an intermediate symbol of the 3 symbols matches some prespecified combination of a plurality of combinations that the aforementioned data pattern and the aforementioned comparison results may take. If these situations are both satisfied, the phase detection circuit 13 generates the phase difference signal UP/DN. The phase difference signal UP/DN is a signal indicating whether to advance or delay a phase of the clock signal CLK.

To determine a value of the data signal Di with precision, it is desirable that a phase (which may be hereinafter referred to as a clock phase) of a rising or falling edge of the clock signal CLK that serves as timing of determination match a phase of an eye center of the eye pattern by the data signal Di. To correct an offset (phase difference) of the clock phase from the eye center of the eye pattern by this data signal Di, the phase detection circuit 13 outputs the phase difference signal UP/DN as described above.

FIG. 1 illustrates 16 combinations of conditions (phase difference detection conditions of 16 conditions) as a plurality of the combinations that the data pattern, which transits like a slope, and the aforementioned comparison results at the intermediate symbol may take. Determination results Do [0], Do [1], and Do [2] are determination results (values of symbols 0 to 2) of 3 consecutive symbols 0, 1, and 2. Comparison results PL [1] and PH [1] are the comparison results of the comparison circuits 12a and 12b at the symbol 1, which is the intermediate symbol of the symbols 0 to 2. In the example of FIG. 1, if the situation that matches any of 4 conditions of the 16 conditions occurs, the phase difference detection is performed (the phase difference signal UP/DN is outputted).

For example, when Do [0]=0, Do [1]=1, Do [2]=2, PL [1]=1, and PH [1]=x (which may be 0 or 1), the phase detection circuit 13 outputs a signal UP that indicates advancement of a phase of the clock signal CLK as the phase difference signal UP/DN. When Do [0]=1, Do [1]=2, Do [2]=3, PL [1]=x, and PH [1]=0, the phase detection circuit 13 outputs a signal DN that indicates delaying of a phase of the clock signal CLK as the phase difference signal UP/DN. When Do [0]=2, Do [1]=1, Do [2]=0, PL [1]=1, and PH [1]=x, the phase detection circuit 13 outputs the signal DN as the phase difference signal UP/DN. When Do [0]=3, Do [1]=2, Do [2]=1, PL [1]=x, and PH [1]=0, the phase detection circuit 13 outputs the signal UP as the phase difference signal UP/DN.

The aforementioned 4 combinations are combinations that are less likely to generate an erroneous phase difference signal than remaining combinations. Such combinations are unlikely to be a factor of false lock. The combinations that are less likely to be the factor of the false lock are determined in advance through a simulation or the like. The factor of the false lock is described below.

The filter 14 filters the phase difference signal UP/DN to generate a phase adjusted value. The filter 14 is not limited to a digital filter. The filter 14 may be a circuit having a charge pump that adjusts a current value according to the phase difference signal UP/DN, converts the adjusted current value to a voltage value, and outputs the voltage value as the phase adjusted value.

The phase adjustment circuit 15 outputs a clock signal CLK whose phase is adjusted, based on the phase adjusted value outputted by the filter 14. The phase adjustment circuit 15 is implemented by means of a voltage-controlled oscillator (VCO) or a phase interpolation circuit (phase interpolator), for example.

(Regarding the False Lock Factor)

In the following, the false lock factors are described before a description is given of an overall operation or effects of the CDR circuit 10.

Figure 2:
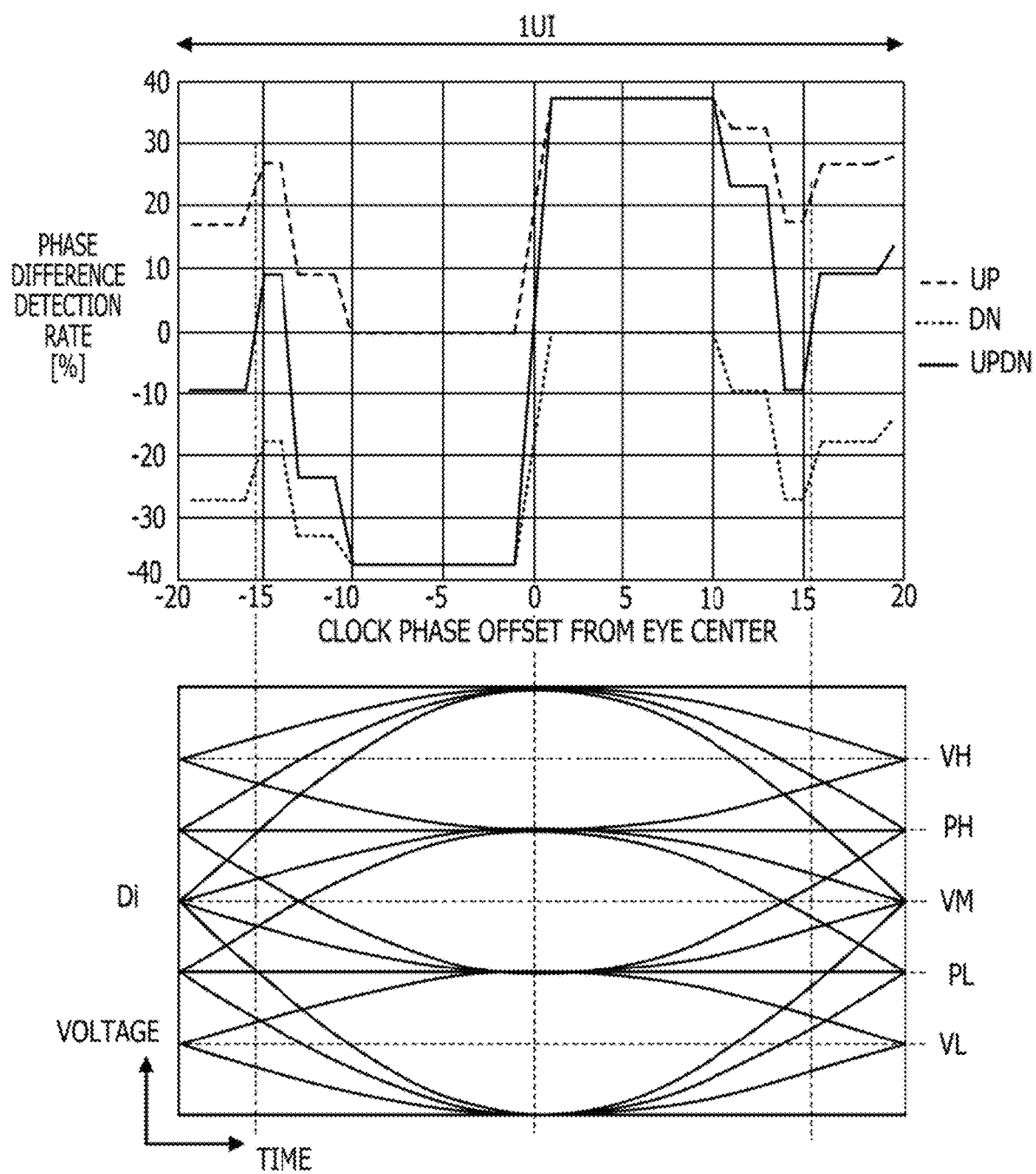
FIG. 2 is a diagram illustrating a phase difference detection characteristic if phase difference detection is performed on all of 16 conditions.

FIG. 2 is a diagram illustrating an example of a phase difference detection characteristic if the phase difference detection is performed on all of the 16 conditions. In the lower part of FIG. 2, all transitions of the data signal Di of PAM4 are denoted by the eye patterns. The vertical axis represents a voltage and the horizontal axis represents time.

In the upper part of FIG. 2 is illustrated an example of a simulation result of a relation of the phase difference detection rate in a case where the phase difference detection is performed in all of the 16 conditions illustrated in FIG. 1 and the offset of the clock phase from the eye center. The vertical axis represents the phase difference detection rate [%] and the horizontal axis represents the offset of the clock phase from the eye center when 1 UI is expressed in a range from −20 to 20. A positive phase difference detection rate represents a probability that the signal UP that advances a phase is outputted. A negative phase difference detection rate represents a probability that the signal DN that delays a phase is outputted. A straight line marked as "UPDN" is a sum of the probability that the signal UP is outputted and the probability that the signal DN is outputted.

When the offset of the clock phase is near 0, the signal UP and the signal DN are generated at a comparable level, and "UPDN" is 0%. Such a point at which "UPDN" is 0% and a change from negative to positive occurs is a lock point. As illustrated in FIG. 2, however, such a point is also present in a data transition part in the neighborhood of point which the offset of the clock phase is −15 or +15. For example, even if the clock phase is located in the data transition part and not at the eye center (even if phase advancement or phase delay occurs), the false lock is likely to occur at that position.

A reason why the lock point occurs in the data transition part in this manner is described below.

Figure 3:
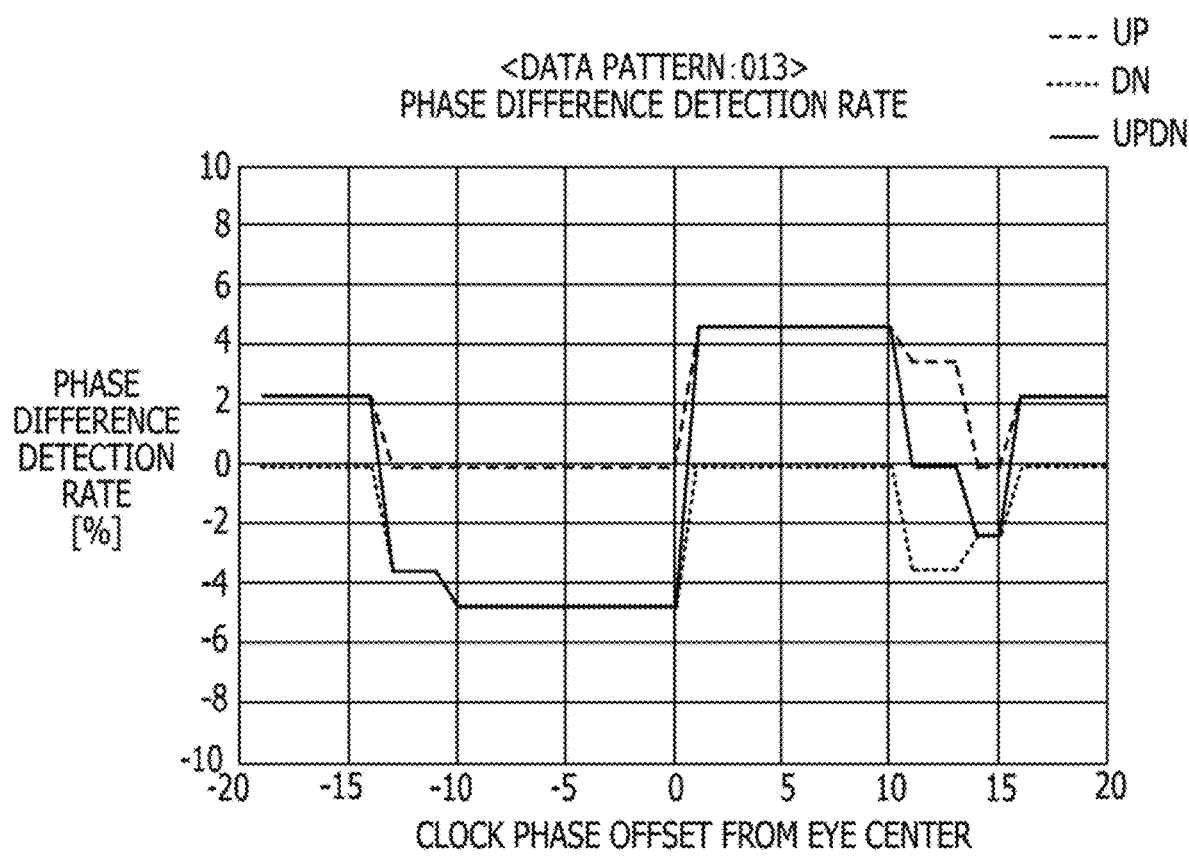
FIG. 3 is a diagram illustrating a simulation result of the phase difference detection characteristic of a data pattern for which a value of 3 consecutive symbols is determined to be 013.

FIG. 3 is a diagram illustrating an example of the simulation result of the phase difference detection characteristic of a data pattern for which a value of 3 consecutive symbols is determined to be 013. The vertical axis represents the phase difference detection rate [%] and the horizontal axis represents the offset of the clock phase from the eye center when 1 UI is expressed in a range from −20 to 20.

In this data pattern, even though the offset of the clock phase is negative (even though the phase advancement occurs), there is a part where the phase difference detection rate of "UPDN" is positive. Even though the offset of the clock phase is positive (even though the phase delay occurs), there is a part where the phase difference detection rate of "UPDN" is negative.

One of reasons why such a part is present is, for example, that a case is present where a data pattern is determined as a data pattern different from an actual data pattern, as described below.

Figure 4:
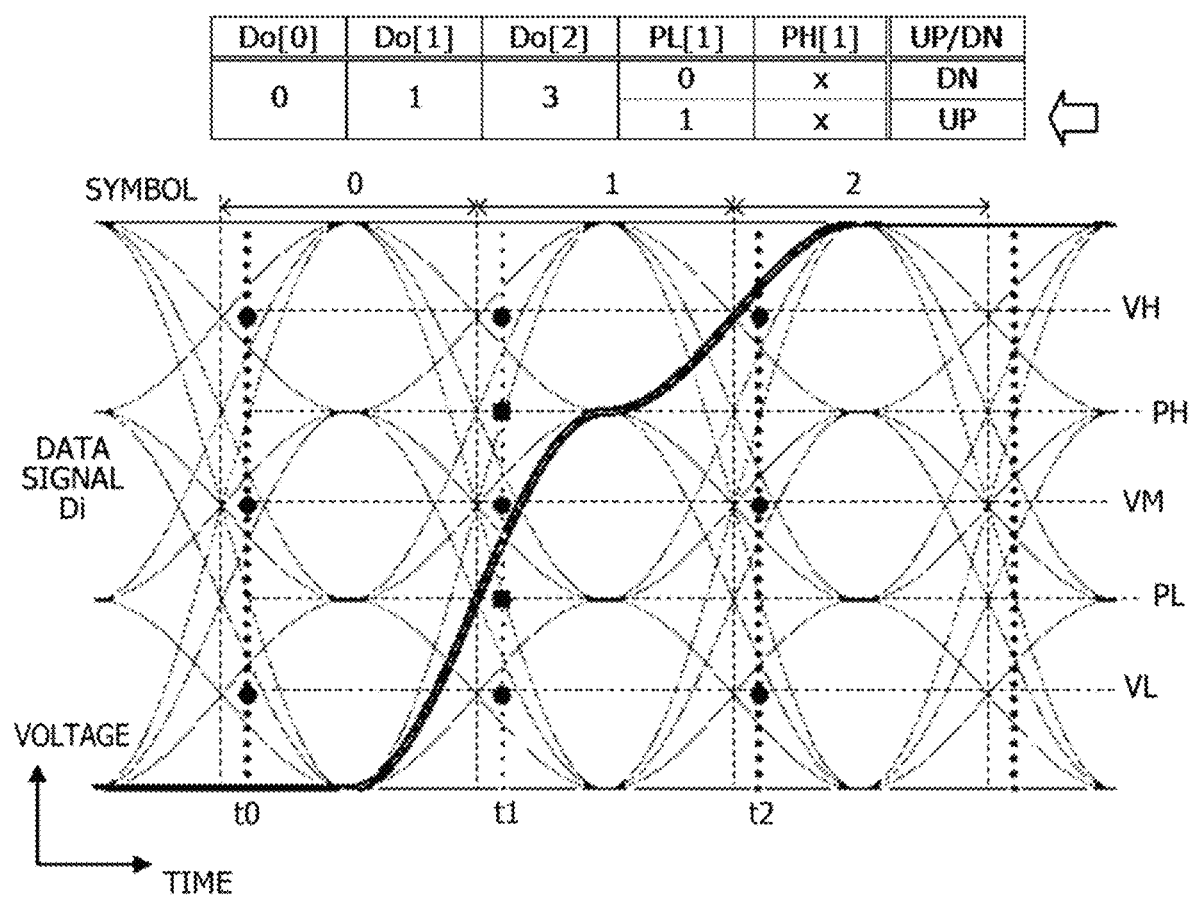
FIG. 4 is a diagram illustrating an example in which a value of 3 consecutive symbols is determined to be 013 despite a data pattern in which the value of the 3 consecutive symbols is 023.

FIG. 4 is a diagram illustrating an example in which a value of 3 consecutive symbols is determined to be 013 despite a data pattern in which the values of the 3 consecutive symbols is 023. The vertical axis represents a voltage and the horizontal axis represents time.

Timing t0, t1, and t2 represent determination timing (clock phase) at the symbols 0, 1, and 2. At the timing t0, Di<VL. At the timing of t1, VL<Di<VM. At the timing of t2, VM<Di<VH. Therefore, it is determined that Do [0]=0, Do [1]=1, and Do [2]=3.

At the timing t1, as Di>Pl, PL [1]=1, and the signal UP is outputted as the phase difference signal UP/DN.

As illustrated in FIG. 4, since the clock phase represented by the timing t0 to t2 is located before the eye center of each symbol, the phase advancement occurs. However, since the signal UP is outputted as described above, there occurs a situation in which there is the part where the phase difference detection rate of "UPDN" is positive even though the phase advancement occurs.

Since the aforementioned 16 conditions include the condition from the combination of Do [0]=0, Do [1]=1, Do [2]=3, and PL [1]=1 that is likely to generate the erroneous phase difference signal UP/DN, the false lock is likely to occur. For example, the conditions from the aforementioned combination may be the false lock factor.

(Example of Operation of the CDR Circuit 10)

In the following, an example of an overall operation of the CDR circuit 10 of the first embodiment is described with reference to FIG. 1.

When receiving the data signal Di, the data determination circuit 11 outputs the result Do of the determination that determines the value of the data signal Di, based on the result of the comparisons that compare the thresholds VL, VM, and VH with the data signal Di at the timing synchronized with the clock signal CLK.

The comparison circuit 12a outputs the result of the comparison that compares the data signal Di with the threshold PL at the timing synchronized with the clock signal CLK. The comparison circuit 12b outputs the result of the comparison that compares the data signal Di with the threshold PH at the timing synchronized with the clock signal CLK.

Based on the determination result outputted by the data determination circuit 11 and the comparison results outputted by the comparison circuits 12a and 12b, the phase detection circuit 13 generates the phase difference signal UP/DN if the 4 conditions that are not excluded of the 16 conditions as illustrated in FIG. 1 occur. The condition by the aforementioned combination of Do [0]=0, Do [1]=1, Do [2]=3, and PL [1]=1 that is likely to generate the false lock factor is excluded from the 4 conditions illustrated in FIG. 1.

The filter 14 filters the phase difference signal UP/DN to generate a phase adjusted value. The phase adjustment circuit 15 outputs the clock signal CLK whose phase is adjusted, based on the phase adjusted value outputted by the filter 14.

Figure 5:
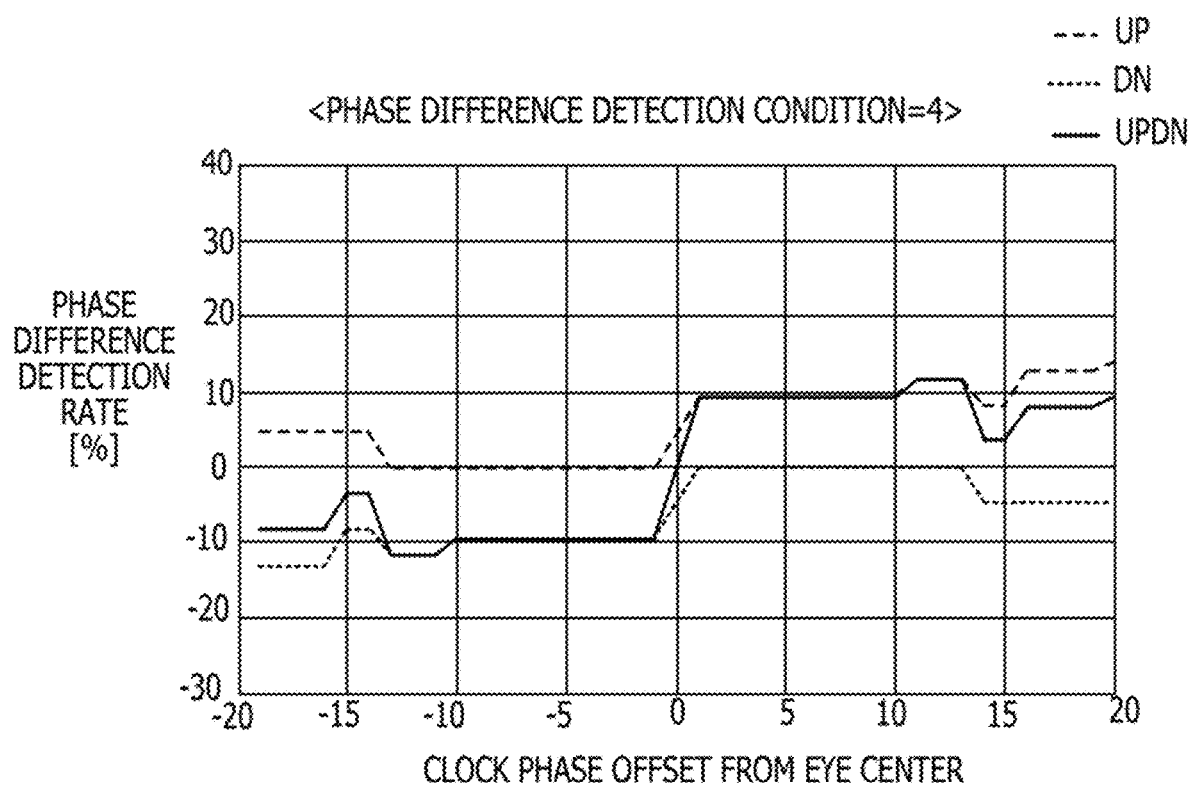
FIG. 5 is a diagram illustrating an example of the phase difference detection characteristic if the phase difference detection is performed on 4 conditions.

FIG. 5 is a diagram illustrating an example of the phase difference detection characteristic if the phase difference detection is performed on the 4 conditions. The vertical axis represents the phase difference detection rate [%] and the horizontal axis represents the offset of the clock phase from the eye center when 1 UI is expressed in a range from −20 to 20.

If the phase difference detection is performed only on the 4 conditions, as illustrated in FIG. 5, the point where "UPDN" is 0% and the change from negative to positive occurs is no longer present in any part other than the part where the offset of the clock phase is 0. Consequently, occurrence of the false lock may be suppressed.

As described above, according to the CDR circuit 10 of the first embodiment, the phase difference detection is performed only when some conditions occur even if the slope shaped data pattern is detected. Therefore, it is possible to avoid the conditions that become the false lock factors and to suppress the occurrence of the false lock. The number of the comparison circuits is not increased for the CDR circuit, as disclosed in Japanese Laid-open Patent Publication No. 2018-137551, for example. Thus, the increase in the power consumption may also be suppressed.

Although the above-mentioned description illustrates the example in which the phase difference detection is performed on the 4/16 conditions, the phase difference detection is not limited to this, and may be performed on the 8/16 conditions or 2/16 conditions, for example. To avoid the phase adjustment biased in either one of a direction for advancing a phase or a direction for delaying a phase being performed, the conditions are narrowed down so that the conditions (combinations) that cause output of the signal UP as the phase difference signal UP/DN and the conditions (combinations) that cause output of the signal DN are the same in number.

FIG. 6 is a diagram illustrating an example of the 8 conditions of the 16 conditions on which the phase difference detection is performed;

FIG. 6 illustrates an example in which the phase difference detection is further performed on the following 4 conditions, in addition to the 4 conditions illustrated in FIG. 1.

When Do [0]=0, Do [1]=1, Do [2]=3, PL [1]=1, and PH [1]=x, the phase detection circuit 13 outputs the signal UP as the phase difference signal UP/DN. When Do [0]=0, Do [1]=2, Do [2]=3, PL [1]=x, and PH [1]=0, the phase detection circuit 13 outputs the signal DN as the phase difference signal UP/DN. When Do [0]=3, Do [1]=1, Do [2]=0, PL [1]=1, and PH [1]=x, the phase detection circuit 13 outputs the signal DN as the phase difference signal UP/DN. When Do [0]=3, Do [1]=2, Do [2]=0, PL [1]=x, and PH [1]=0, the phase detection circuit 13 outputs the signal UP as the phase difference signal UP/DN.

Figure 7:
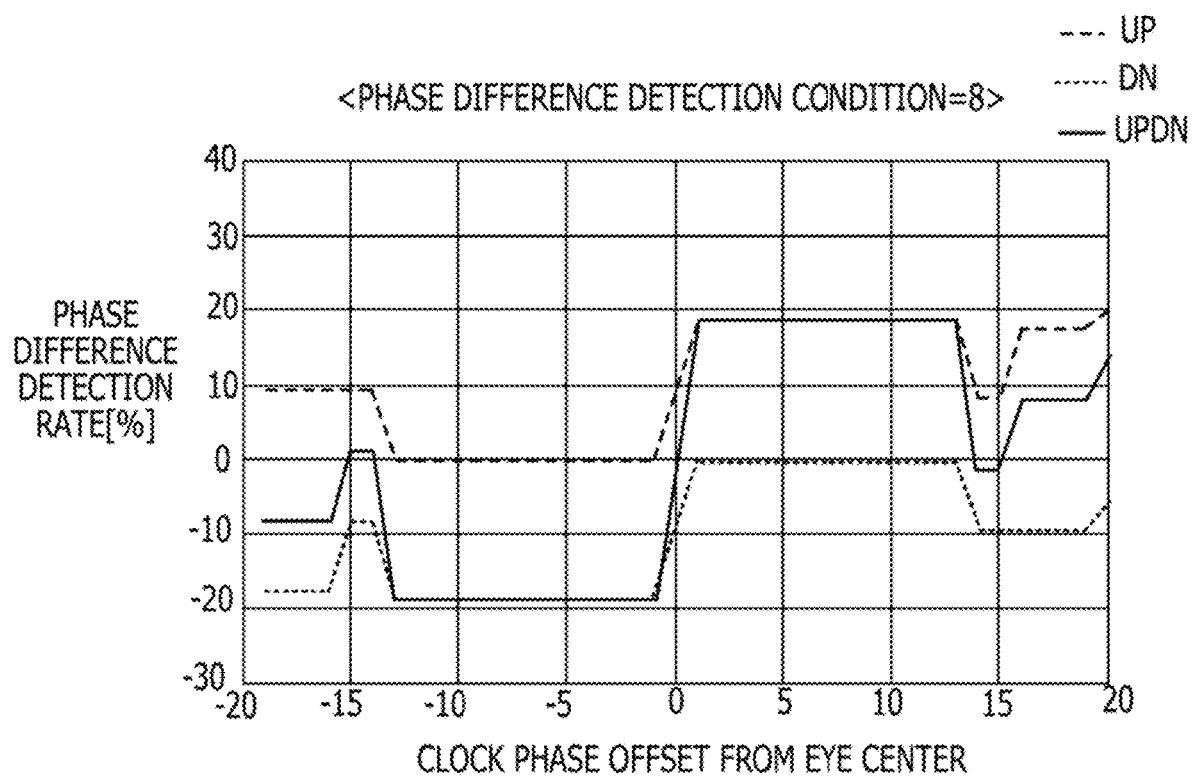
FIG. 7 is a diagram illustrating an example of the phase difference detection characteristic if the phase difference detection is performed on the 8 conditions.

FIG. 7 is a diagram illustrating an example of the phase difference detection characteristic if the phase difference detection is performed on the 8 conditions. The vertical axis represents the phase difference detection rate [%] and the horizontal axis represents the offset of the clock phase from the eye center when 1 UI is expressed in a range from −20 to 20.

If the phase difference detection is performed only on the 8 conditions, as illustrated in FIG. 7, the point where "UPDN" is 0% and the change from negative to positive occurs is present in any part other than the part where the offset of the clock phase is 0. However, an absolute value of the probability that the signal UP is outputted although the phase advancement occurs and the probability that the signal DN is outputted although the phase delay occurs is smaller than a case where the 16 conditions are used. Consequently, the occurrence of the false lock may be suppressed.

FIG. 8 is a diagram illustrating an example of the 2 conditions of the 16 conditions on which the phase difference detection is performed.

FIG. 8 illustrates an example in which the phase difference detection is performed on the following 2 conditions of the 4 conditions illustrated in FIG. 1.

When Do [0]=1, Do [1]=2, Do [2]=3, PL [1]=x, and PH [1]=0, the phase detection circuit 13 outputs the signal DN as the phase difference signal UP/DN. When Do [0]=3, Do [1]=2, Do [2]=1, PL [1]=x, and PH [1]=0, the phase detection circuit 13 outputs the signal UP as the phase difference signal UP/DN.

Figure 9:
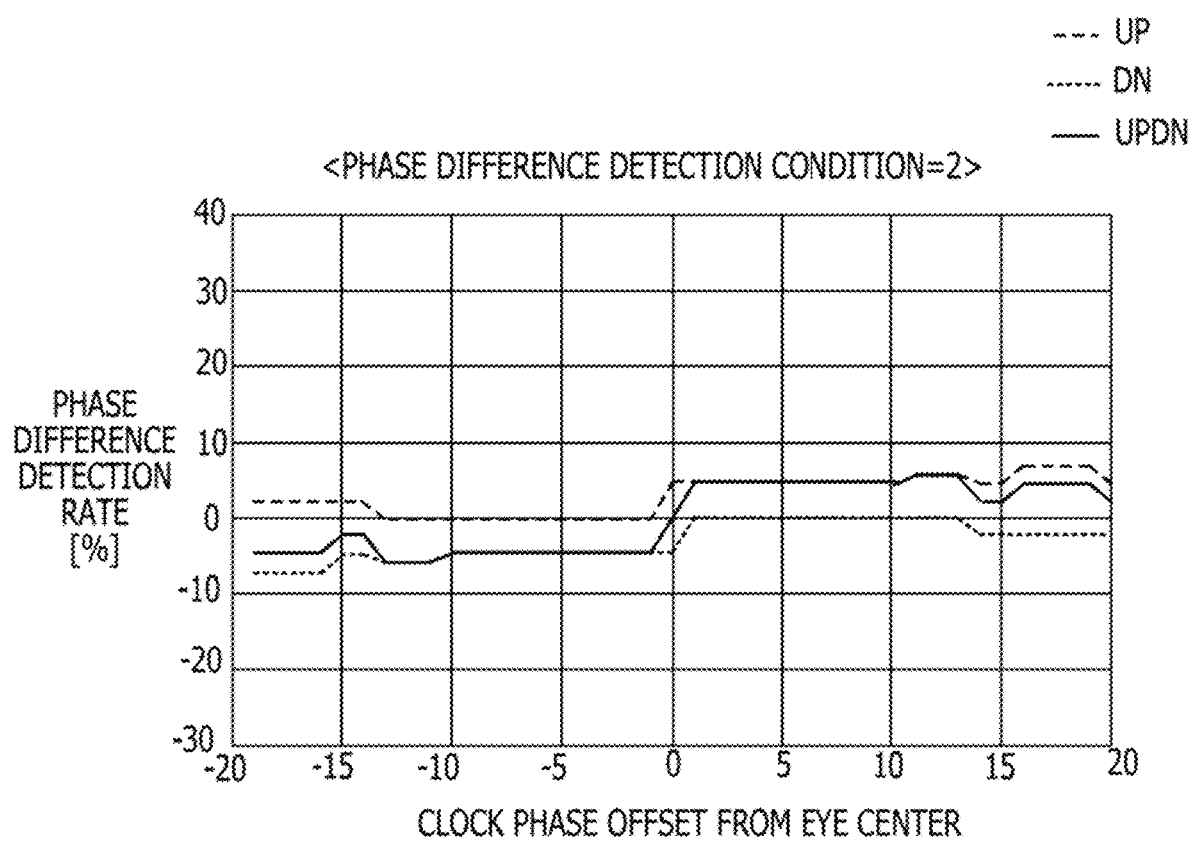
FIG. 9 is a diagram illustrating an example of the phase difference detection characteristic if the phase difference detection is performed on the 2 conditions.

FIG. 9 is a diagram illustrating an example of the phase difference detection characteristic if the phase difference detection is performed on the 2 conditions. The vertical axis represents the phase difference detection rate [%] and the horizontal axis represents the offset of the clock phase from the eye center when 1 UI is expressed in a range from −20 to 20.

If the phase difference detection is performed only on the 2 conditions, as illustrated in FIG. 9, the lock point where "UPDN" is 0% and the change from negative to positive occurs is no longer present in any part other than the part where the offset of the clock phase is 0. The absolute value of the probability that the signal UP is outputted although the phase advancement occurs and the probability that the signal DN is outputted although the phase delay occurs is smaller than the case where the 4 conditions are used. Consequently, the occurrence of the false lock may be further suppressed.

If the phase difference detection is performed only on the 2 conditions, the comparison circuit 12a becomes redundant because the comparison result PL [1] is not considered.

The conditions for performing the phase difference detection may be made switchable. As the number of the conditions for the phase difference detection to be performed is smaller, the absolute value of the phase difference detection rate is smaller. Therefore, a function to compensate that may be provided. Examples of these are described in the embodiments to be described below.

Although it is assumed in the foregoing that the data signal Di is the data signal of PAM4, the data signal is not limited to this and may also be more multivalued data signal (for example, a data signal of PAM8 or PAM16).

Second Embodiment

Figure 10:
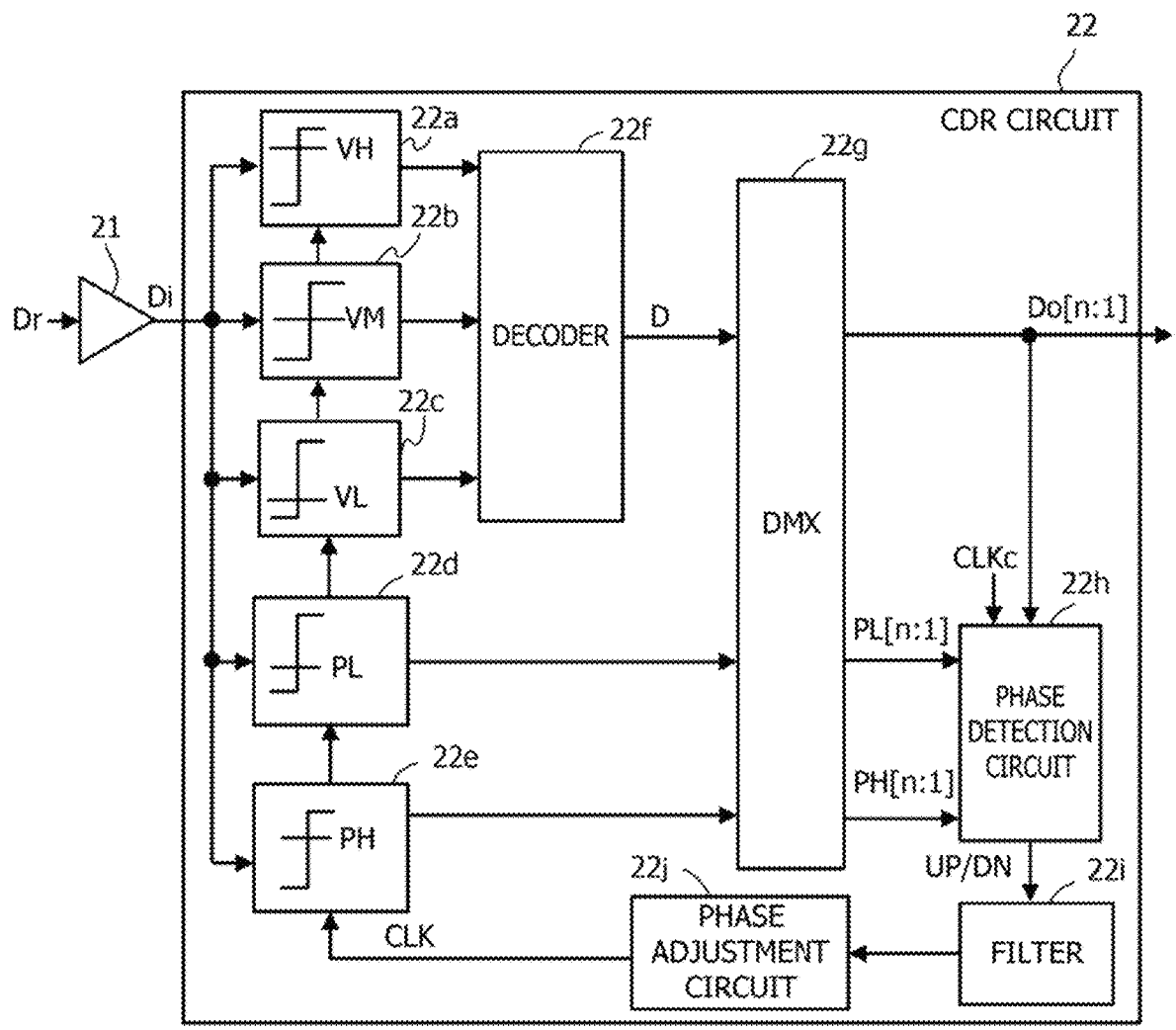
FIG. 10 is a diagram illustrating an example of a receiver including a CDR circuit of a second embodiment.

FIG. 10 is a diagram illustrating an example of a receiver including a CDR circuit of a second embodiment.

In the following example, although a description is given using the data signal of PAM4, a more multivalued data signal is also applicable. This point applies to the embodiments to be described hereinafter.

A receiver 20 has an equalizing circuit 21 and a CDR circuit 22.

The equalizing circuit 21 receives a data signal Dr of PAM4 in which a 2-bit value is associated with each of the 4 potential levels separated by the thresholds VH, VM, and VL, performs equalization processing on the data signal Dr, and outputs the data signal Di. For example, a continuous time linear equalizer (CTLE) may be used as the equalizing circuit 21. The equalizing circuit 21 is also applicable to the CDR circuit 10 of the first embodiment. This point similarly applies to the embodiments to be described hereinafter.

The CDR circuit 22 has comparison circuits 22a, 22b, 22c, 22d, and 22e, a decoder 22f, a demultiplexer (denoted as DMX in FIG. 4) 22g, a phase detection circuit 22h, a filter 22i, and a phase adjustment circuit 22j.

The comparison circuits 22a to 22c and the decoder 22f implement a function similar to the data determination circuit 11 in FIG. 1.

The comparison circuit 22a outputs a comparison result of the data signal Di and the threshold VH at the timing synchronized with the clock signal CLK. When the data signal Di is larger than the threshold VH, the comparison circuit 22a outputs 1. When the data signal Di is smaller than the threshold VH, the comparison circuit 22a outputs 0.

The comparison circuit 22b outputs a comparison result of the data signal Di and the threshold VM at the timing synchronized with the clock signal CLK. When the data signal Di is larger than the threshold VM, the comparison circuit 22b outputs 1. When the data signal Di is smaller than the threshold VM, the comparison circuit 22b outputs 0.

The comparison circuit 22c outputs a comparison result of the data signal Di and the threshold VL at the timing synchronized with the clock signal CLK. When the data signal Di is larger than the threshold VL, the comparison circuit 22c outputs 1. When the data signal Di is smaller than the threshold VL, the comparison circuit 22c outputs 0.

The decoder 22f outputs the 2-bit value of each symbol of the data signal Di, as determination result D, based on the comparison results outputted by the comparison circuits 22a to 22c. If the comparison results outputted by the comparison circuits 22a to 22c are all "1", the decoder 22f outputs "11" (which is 3 in the decimals). If the comparison result outputted by the comparison circuit 22a is "0" and the comparison results outputted by the comparison circuits 22b and 22c are "1", the decoder 22f outputs "10" (which is 2 in the decimals). If the comparison results outputted by the comparison circuit 22a and 22b are "0" and the comparison result outputted by the comparison circuits 22c is "1", the decoder 22f outputs "01" (which is 1 in the decimals). If the comparison results outputted by the comparison circuits 22a to 22c are all "0", the decoder 22f outputs "00" (which is 0 in the decimals).

The comparison circuit 22d outputs the result of the comparison that compares the data signal Di with the threshold PL at the timing synchronized with the clock signal CLK. When the data signal Di is larger than the threshold PL, the comparison circuit 22d outputs 1. When the data signal Di is smaller than the threshold PL, the comparison circuit 22d outputs 0.

The comparison circuit 22e outputs a result of a comparison that compares the data signal Di with the threshold PH at the timing synchronized with the clock signal CLK. When the data signal Di is larger than the threshold PH, the comparison circuit 22e outputs 1. When the data signal Di is smaller than the threshold PH, the comparison circuit 22e outputs 0.

If the CDR circuit 22 performs a half rate operation, two each of the comparison circuits 22a to 22e are provided.

The demultiplexer 22g demultiplexes the determination result D and the comparison results outputted by the comparison circuits 22d and 22e, respectively, into a bit count worth of n (n≥4) symbols, and outputs a determination result Do [n:1] and comparison results PL [n:1] and PH [n:1]. The bit count for the n symbols is set according to, for example, processing power (to be determined by a frequency of an operation clock signal CLKc) of the phase detection circuit 22$h$ that is implemented on a digital circuit.

The phase detection circuit 22$h$ receives the determination result Do [n:1] and the comparison results PL [n:1] and PH [n:1]. The phase detection circuit 22$h$ outputs the phase difference signal UP/DN based on the determination result Do [n:1] and the comparison results PL [n:1] and PH [n:1].

The filter 22$i$ filters the phase difference signal UP/DN to generate the phase adjusted value. The filter 22$i$ is not limited to the digital filter. The filter 22$i$ may be the circuit having the charge pump that adjusts the current value according to the phase difference signal UP/DN, converts the adjusted current value to the voltage value, and outputs the voltage value as the phase adjusted value.

The phase adjustment circuit 22$j$ outputs the clock signal CLK whose phase is adjusted, based on the phase adjusted value outputted by the filter 22$i$. The phase adjustment circuit 22$j$ is implemented by means of the VCO or the phase interpolation circuit, for example.

(Example of the Phase Detection Circuit 22$h$)

Figure 11:
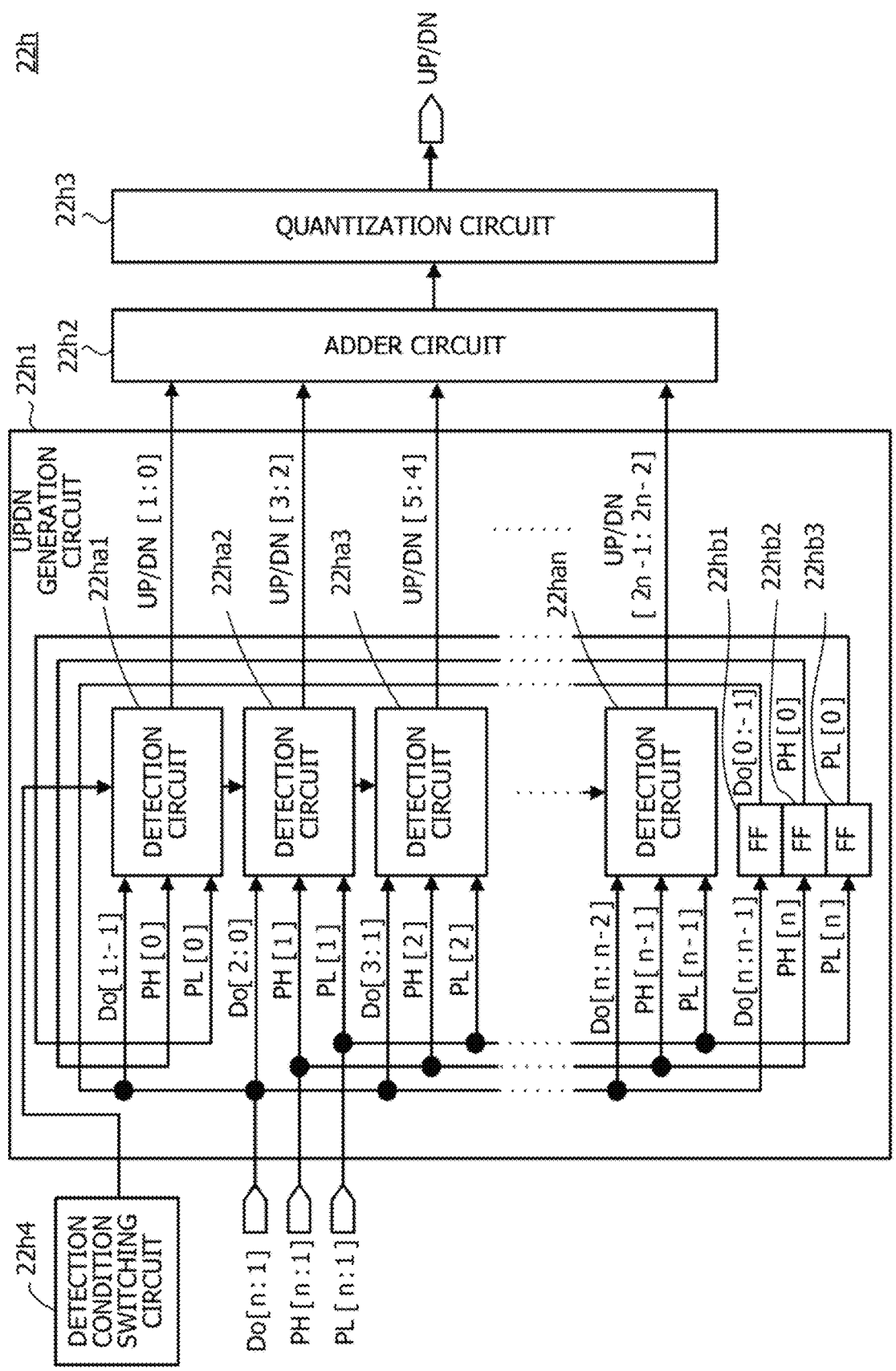
FIG. 11 is a diagram illustrating an example of a phase detection circuit.

FIG. 11 is a diagram illustrating an example of the phase detection circuit.

The phase detection circuit 22$h$ has an UPDN generation circuit 22$h$1, an adder circuit 22$h$2, a quantization circuit 22$h$3, and a detection condition switching circuit 22$h$4.

The UPDN generation circuit 22$h$1 has detection circuits 22$ha$1, 22$ha$2, 22$ha$3, . . . , 22$han$, and flip flops (denoted as FF in FIG. 5) 22$hb$1, 22$hb$2, and 22$hb$3.

Each of the detection circuits 22$ha$1 to 22$han$ receives a determination result (6-bit value) for 3 consecutive symbols of the determination result Do [n:1] of the bit count for the n (n≥4) symbols outputted by the demultipexer 22$g$. Each of the detection circuits 22$ha$1 to 22$han$ receives a comparison result at the intermediate symbol of the aforementioned 3 symbols, of the comparison results PL [n:1] and PH [n:1] of the bit count for the n symbols outputted by the demultiplexer 22$g$. Based on the determination result and the comparison results described above, each of the detection circuits 22$ha$1 to 22$han$ outputs the signal UP or the signal DN as the phase difference signal UP/DN if a situation that matches a phase difference detection condition to be adopted occurs. The phase difference detection condition to be adopted is specified by the detection condition switching circuit 22$h$4.

For example, the detection circuit 22$ha$1 receives a determination result Do [1:−$i$] for 3 consecutive symbols and comparison results PL [0] and PH [0] of the comparison circuits 22$d$ and 22$e$ at the intermediate symbol. Of the determination result Do [1:−1], a determination result Do [0:−1] of 2 temporally earlier symbols is a determination result Do [n:n−1] of 2 symbols on side of the most significant bit (MSB) of the determination result Do [n:1] in an earlier cycle. The comparison result PL [0] is a comparison result PL [n] at the MSB symbol, of the comparison result PL [n:1] of the comparison circuit 22$d$ in the earlier cycle. The comparison result PH [0] is a comparison result PH [n] at the MSB symbol, of the comparison result PH [n:1] of the comparison circuit 22$e$ in the earlier cycle. Based on a determination result Do [1:−$i$] and the comparison results PL [0] and PH [0], the detection circuit 22$ha$1 outputs the signal UP or the signal DN as a phase difference signal UP/DN [1:0] if a situation that matches the phase difference detection condition to be adopted occurs.

The detection circuit 22$ha$2 receives a determination result Do [2:0] for 3 consecutive symbols and comparison results PL [1] and PH [1] of the comparison circuits 22$d$ and 22$e$ at the intermediate symbol. Based on a determination result Do [2:0] and the comparison results PL [1] and PH [1], the detection circuit 22$ha$2 outputs the signal UP or the signal DN as a phase difference signal UP/DN [3:2] if a situation that matches the phase difference detection condition to be adopted occurs.

The detection circuit 22$ha$3 receives a determination result Do [3:1] for 3 consecutive symbols and comparison results PL [2] and PH [2] of the comparison circuits 22$d$ and 22$e$ at the intermediate symbol. Based on a determination result Do [3:1] and the comparison results PL [2] and PH [2], the detection circuit 22$ha$3 outputs the signal UP or the signal DN as a phase difference signal UP/DN [5:4] if a situation that matches the phase difference detection condition to be adopted occurs.

The detection circuit 22$han$ receives a determination result Do [n:n−2] for 3 consecutive symbols and comparison results PL [n−1] and PH [n−1] of the comparison circuits 22$d$ and 22$e$ at the intermediate symbol. Based on a determination result Do [n:n−2] and the comparison results PL [n−1] and PH [n−1], the detection circuits 22$han$ outputs the signal UP or the signal DN as a phase difference signal UP/DN [2n−1:2n−2] if a situation that matches the phase difference detection condition to be adopted occurs.

The signal UP is expressed as +1 and the signal DN −1, for example. These may be expressed by a 2-bit value.

The flip flop 22$hb$1 holds the determination result Do [n:n−1] in synchronization with the unillustrated operation clock signal and outputs the determination result Do [n:n−1] as the determination result Do [0:−1]. The flip flop 22$hb$2 holds the comparison result PH [n] in synchronization with the unillustrated operation clock signal and outputs the comparison result PH [n] as the comparison result PH [0]. The flip flop 22$hb$3 holds the comparison result PL [n] in synchronization with the unillustrated operation clock signal and outputs the comparison result PL [n] as the comparison result PL [0].

The adder circuit 22$h$2 outputs a result of addition that adds the signal UP/DN [1:0] to UPDN [2n−1:2n−2] outputted by the detection circuits 22$ha$1 to 22$han$.

The quantization circuit 22$h$3 quantizes the result of the addition outputted by the adder circuit 22$h$2 in accordance with a bit width (for example, p-bit) that may be processed by a circuit (filter 22$i$) of a rear stage, and outputs a quantization result as the phase difference signal UP/DN. The quantization circuit 22$h$3 may truncate a quantization error or integrate the quantization error to improve noise immunity and use the quantization error in a calculation in a next cycle.

The detection condition switching circuit 22$h$4 supplies to the detection circuits 22$ha$1 to 22$han$ a signal specifying the phase difference detection condition to be adopted. There is a plurality of patterns of the phase difference condition to be adopted, depending on a difference in the number of combinations (number of conditions) to be included. A pattern with a smaller number of combinations to be included has a fewer combinations that become a factor to generate the erroneous phase difference signal UP/DN. In the following example, there are 4 patterns of the phase difference conditions to be adopted: the 2 conditions, the 4 conditions, the 8 conditions, or the 16 conditions. However, the number of the conditions is not limited to these numbers. The phase difference detection conditions to be adopted may be stored in advance in, for example, an unillustrated memory (which may be a register or the like) or may be appropriately changed based on a signal from outside of the phase detection circuit 22$h$.

Figure 12:
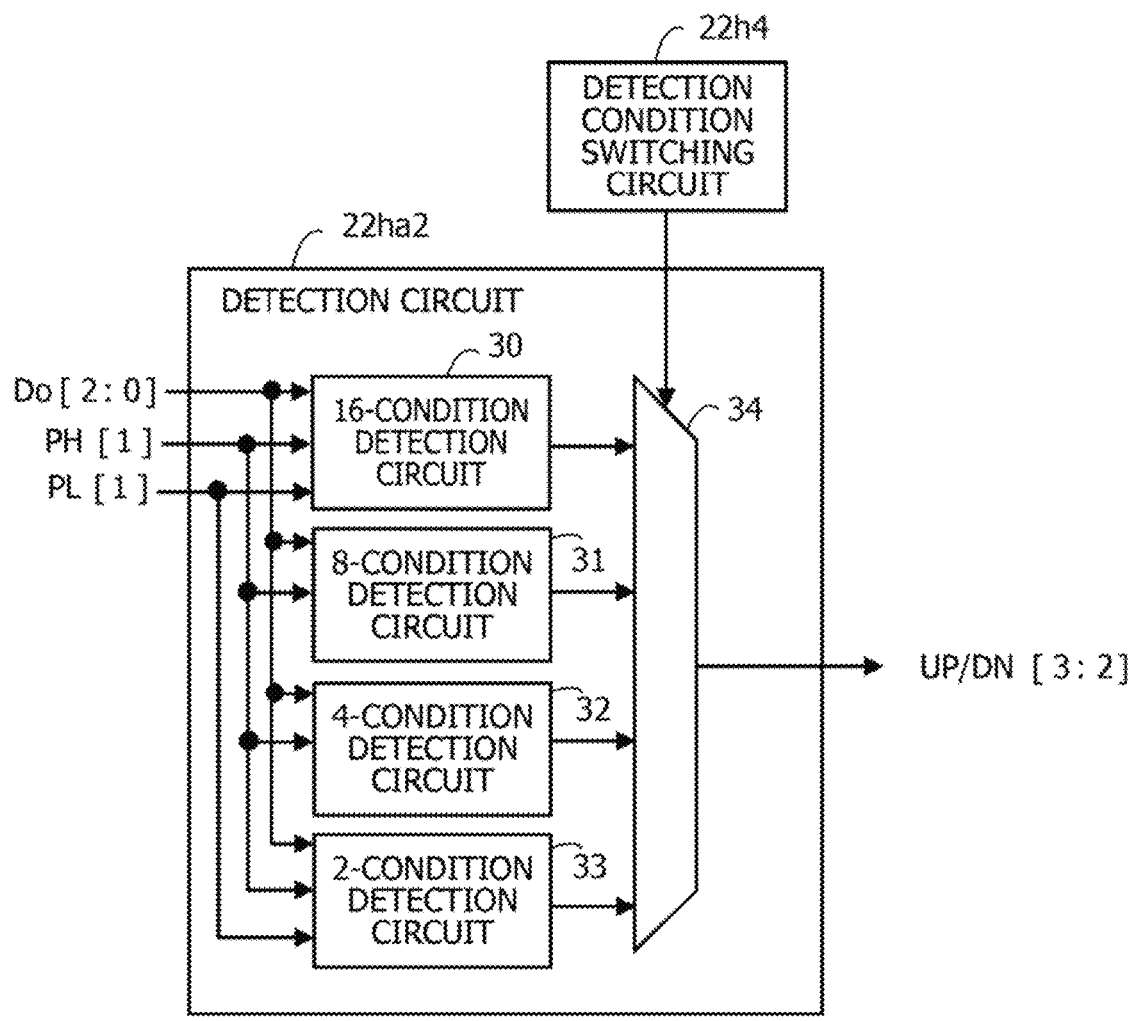
FIG. 12 is a diagram illustrating an example of a detection circuit.

FIG. 12 is a diagram illustrating an example of the detection circuit. Although FIG. 12 illustrates an example of the detection circuit 22*ha*2, the detection circuits 22*ha*1, 22*ha*3 to 22*han* may also be implemented with a similar configuration.

The detection circuit 22*ha*2 has a 16-condition detection circuit 30, an 8-condition detection circuit 31, a 4-condition detection circuit 32, a 2-condition detection circuit 33, and a selection circuit 34.

The 16-condition detection circuit 30 is a logic circuit that outputs the signal UP or the signal DN when a situation that matches any of the 16 conditions as illustrated in FIG. 1 or the like occurs.

The 8-condition detection circuit 31 is a logic circuit that outputs the signal UP or the signal DN, for example, when a situation that matches any of the 8 conditions as illustrated in FIG. 6, for example, occurs.

The 4-condition detection circuit 32 is a logic circuit that outputs the signal UP or the signal DN, for example, when a situation that matches any of the 4 conditions as illustrated in FIG. 1, for example, occurs.

The 2-condition detection circuit 33 is a logic circuit that outputs the signal UP or the signal DN, for example, when a situation that matches any of the 2 conditions as illustrated in FIG. 8, for example, occurs.

Based on the signal supplied from the detection condition switching circuit 22*h*4, the selection circuit 34 selects a signal to be outputted from any of the 16-condition detection circuit 30, the 8-condition detection circuit 31, the 4-condition detection circuit 32, or the 2-condition detection circuit 33 and outputs the signal as a phase difference signal UP/DN [3:2].

According to the CDR circuit 22 of the second embodiment as described above, the operation substantially similar to the CDR circuit 10 of the first embodiment is performed and similar effects are achieved if the 8 conditions, the 4 conditions, or the 2 conditions are adopted as the phase difference detection conditions. According to the CDR circuit 22 of the second embodiment, the phase difference detection conditions to be adopted may be switched.

Third Embodiment

As illustrated in FIG. 5, FIG. 7, and FIG. 9, as the number of the phase difference detection conditions is smaller, the phase difference detection rate decreases. A CDR circuit of the third embodiment performs sensitivity adjustment as described below to make up for this decrease.

The CDR circuit of the third embodiment includes a phase difference detection circuit that differs from the phase detection circuit 22*h* in the CDR circuit 22 of the second embodiment.

Figure 13:
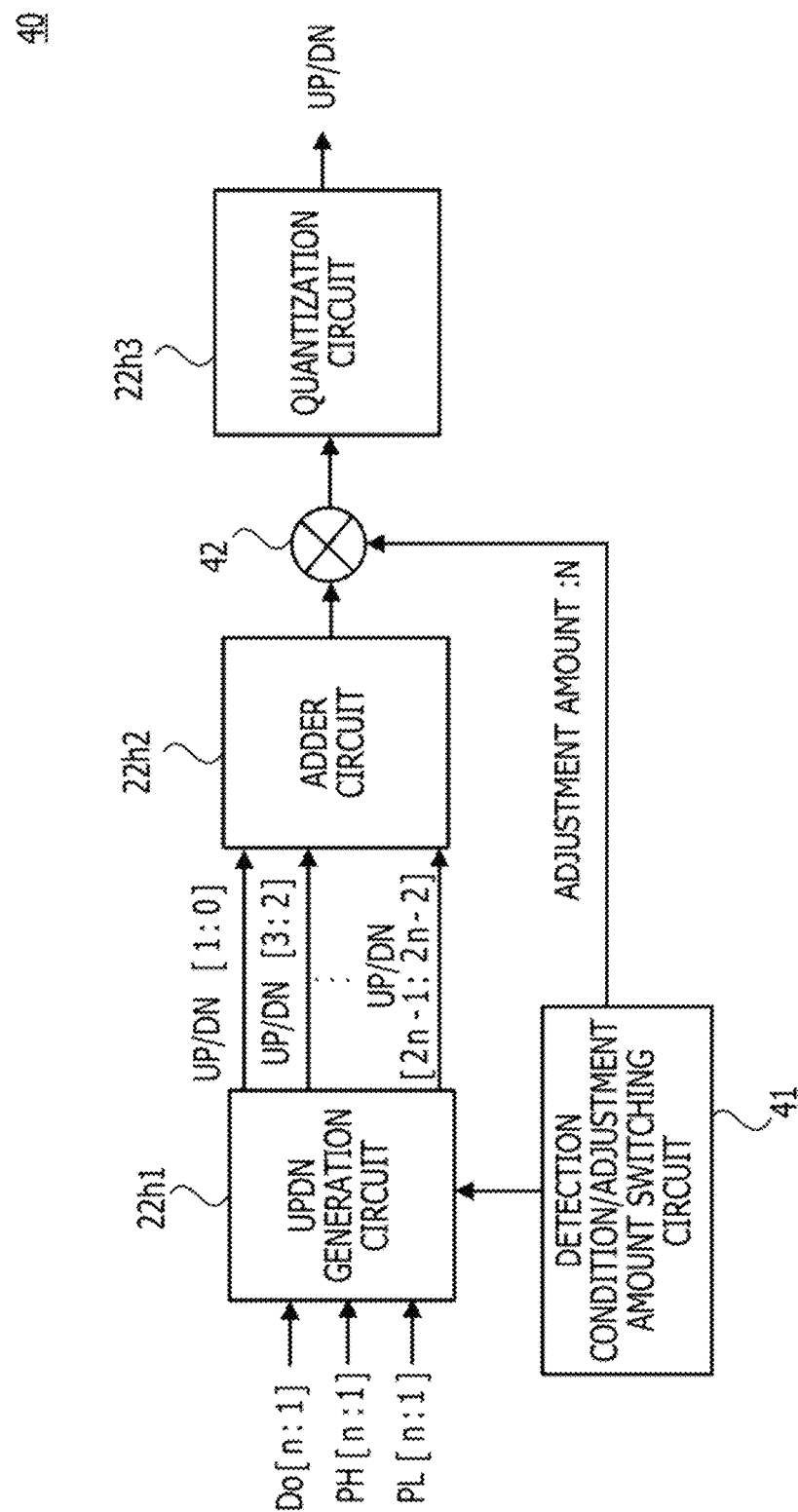
FIG. 13 is a diagram illustrating an example of a phase detection circuit in a CDR circuit of a third embodiment.

FIG. 13 is a diagram illustrating an example of the phase detection circuit in the CDR circuit of the third embodiment. In FIG. 13, the same elements as the elements of the phase detection circuit 22*h* illustrated in FIG. 11 are assigned with the same reference signs.

A phase detection circuit 40 in the CDR circuit of the third embodiment has a detection condition/adjustment amount switching circuit 41 and a multiplier circuit 42.

The detection condition/adjustment amount switching circuit 41 has a function to supply to the UPDN generation circuit 22*h*1 a signal specifying phase difference detection conditions to be adopted, similarly to the detection condition switching circuit 22*h*4 of the CDR circuit 22 of the second embodiment. The detection condition/adjustment amount switching circuit 41 outputs a sensitivity adjustment amount N according to the phase difference detection conditions to be adopted. The adjustment amount N is a value obtained by dividing the number of all of the phase difference detection conditions by the number of the phase difference detection conditions to be adopted (number of combinations).

The multiplier circuit 42 outputs a product of the addition result outputted by the adder circuit 22*h*2 and the adjustment amount N. Consequently, the quantization circuit 22*h*3 outputs the phase difference signal UP/DN that quantifies the product of the addition result and the adjustment amount N. For example, the filter 22*i* in the stage behind the phase detection circuit 22*h* generates a phase adjusted value based on the product.

FIG. 14 is a diagram illustrating a relation of the phase difference detection conditions and the sensitivity adjustment amount.

If the phase difference detection conditions are the 16 conditions (the conditions are not narrowed down), the phase difference detection rate is 24/64 and the adjustment amount N is 1. The sensitivity with the phase difference detection rate of this time is 1.

If the phase difference detection conditions are the 8 conditions, the phase difference detection rate is 12/64 and the adjustment amount N is 2. In the case of the 8 conditions, the phase difference detection rate is 1/2 of a case of the 16 conditions. Therefore, the sensitivity decreases to 0.5, but setting N=2 makes it possible to increase the sensitivity to 1.

If the phase difference detection conditions are the 4 conditions, the phase difference detection rate is 6/64 and the adjustment amount N is 4. In the case of the 4 conditions, the phase difference detection rate is 1/4 of the case of the 16 conditions. Therefore, the sensitivity decreases to 0.25, but setting N=4 makes it possible to increase the sensitivity to 1.

If the phase difference detection conditions are the 2 conditions, the phase difference detection rate is 3/64 and the adjustment amount N is 8. In the case of the 2 conditions, the phase difference detection rate is 1/8 of the case of the 16 conditions. Therefore, the sensitivity decreases to 0.125, but setting N=8 makes it possible to increase the sensitivity to 1.

A combination of the phase difference detection conditions to be adopted and the adjustment amount N may be stored in advance in, for example, the unillustrated memory (which may be the register or the like) or may be appropriately changed based on a signal from outside of the phase detection circuit 40.

Figure 15:
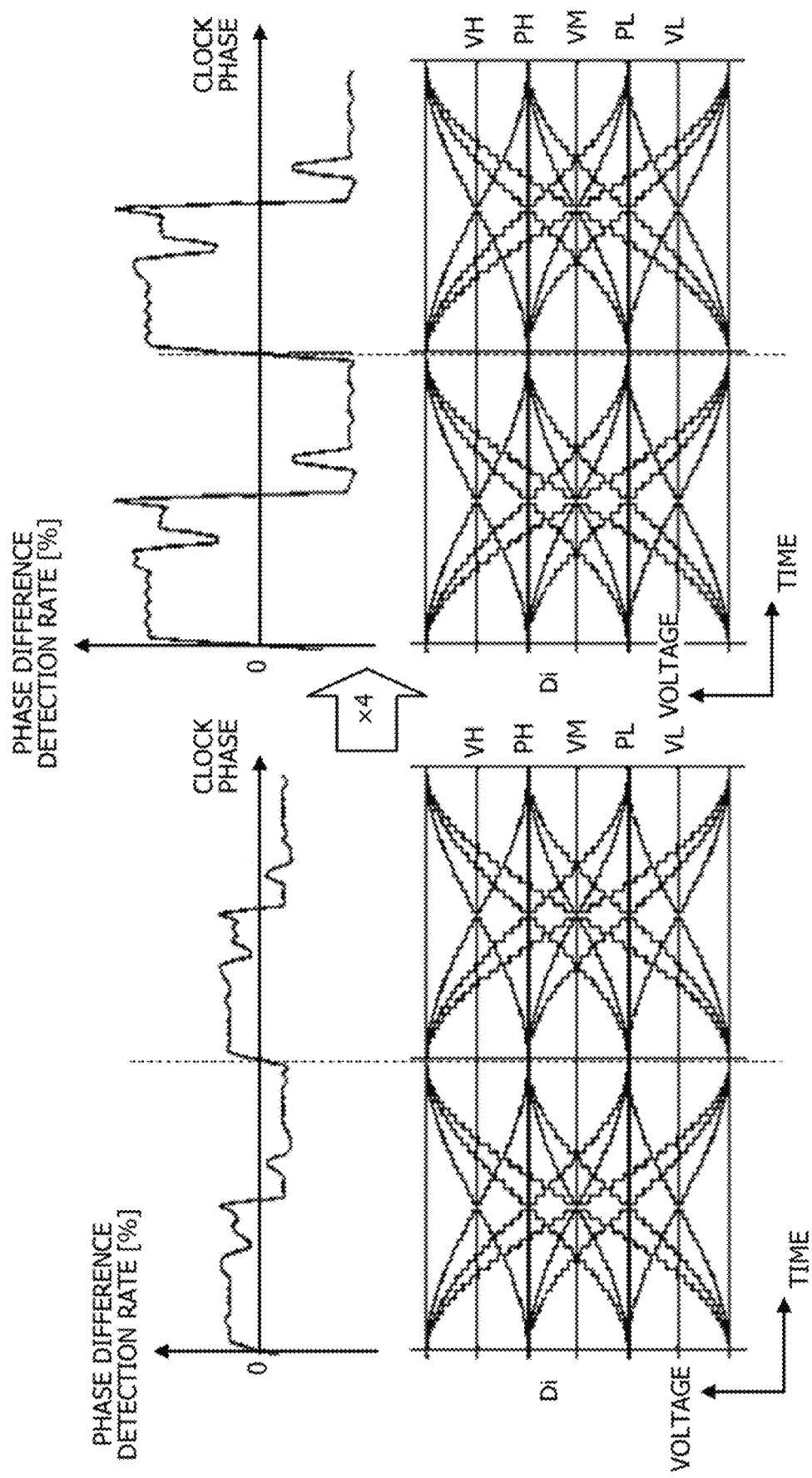
FIG. 15 is a diagram illustrating an example of a phase difference detection rate before and after the sensitivity adjustment, if 4 conditions are adopted as the phase difference detection condition.

FIG. 15 is a diagram illustrating an example of the phase difference detection rate before and after the sensitivity adjustment, if the 4 conditions are adopted as the phase difference detection condition. FIG. 15 illustrates a sum (corresponding to "UPDN" in FIG. 5) of the probability that the signal UP is outputted and the probability that the signal DN is outputted, respectively, as the phase difference detection rate. The vertical axis represents the phase difference detection rate [%] and the horizontal axis represents the clock phase. In FIG. 15, all the transitions of the data signal Di of PAM4 are denoted by the eye patterns. The vertical axis represents a voltage and the horizontal axis represents time.

By multiplying the addition result outputted by the adder circuit 22*h*2 by the adjustment amount N=4 to increase the sensitivity (increasing an amount of phases to be adjusted by the phase adjustment circuit 22*j* at a time), it is possible to equivalently increase the absolute value of the phase difference detection rate, as illustrated in FIG. 15.

The above-described sensitivity adjustment function is also applicable to the CDR circuit 10 of the first embodiment.

Fourth Embodiment

A CDR circuit of a fourth embodiment has a function to determine whether or not the phase adjusted value outputted by the filter 22i is fixed (the phase adjusted value falls within a predetermined threshold range for a predetermined period of time), and to switch the phase difference detection condition to a pattern with a large number of conditions (number of combinations), every time the CDR circuit of the fourth embodiment determines that the phase adjusted value is fixed.

Figure 16:
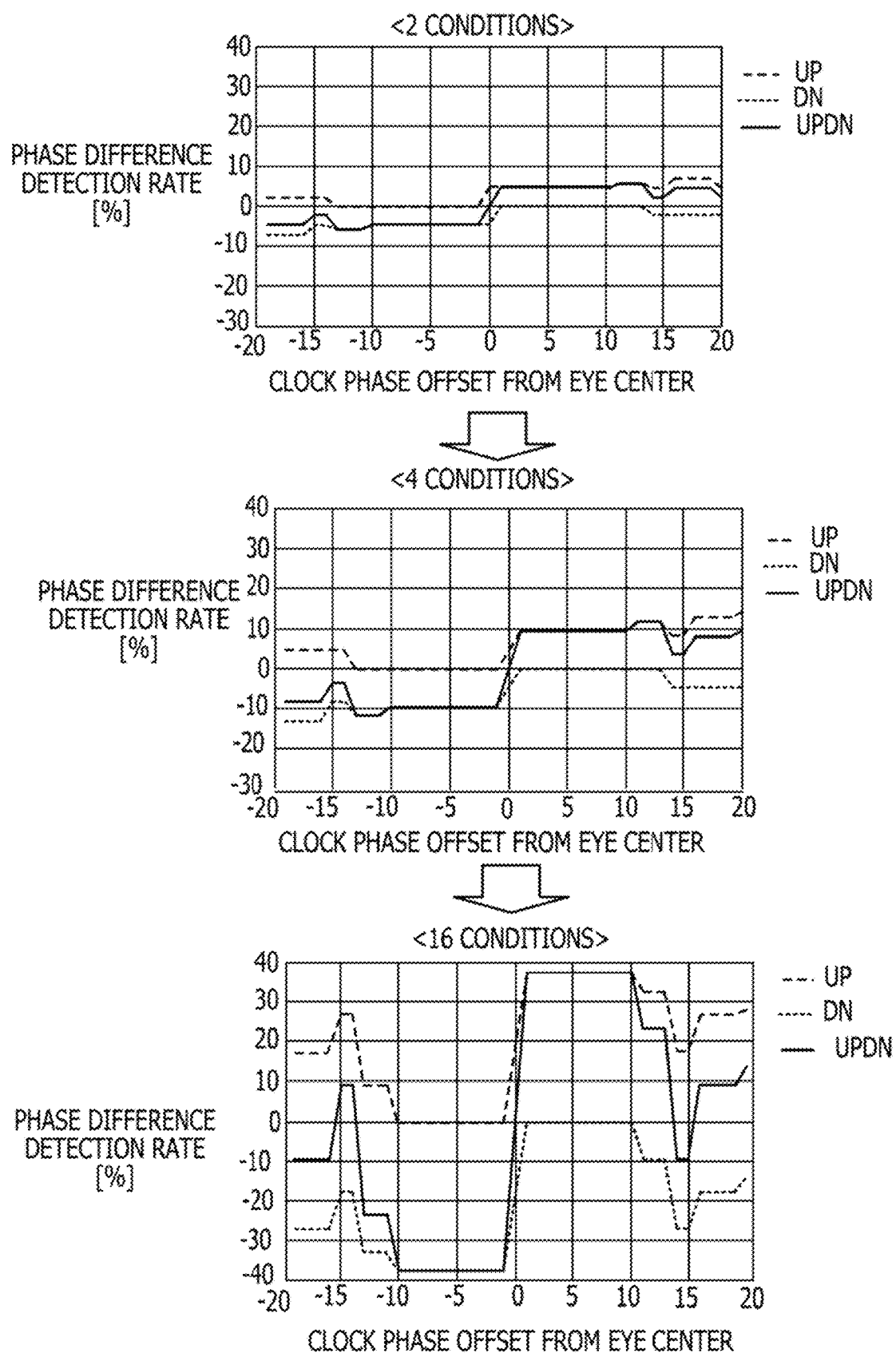
FIG. 16 is a diagram illustrating an example of switching of the phase difference detection conditions (before the sensitivity adjustment)
Figure 17:
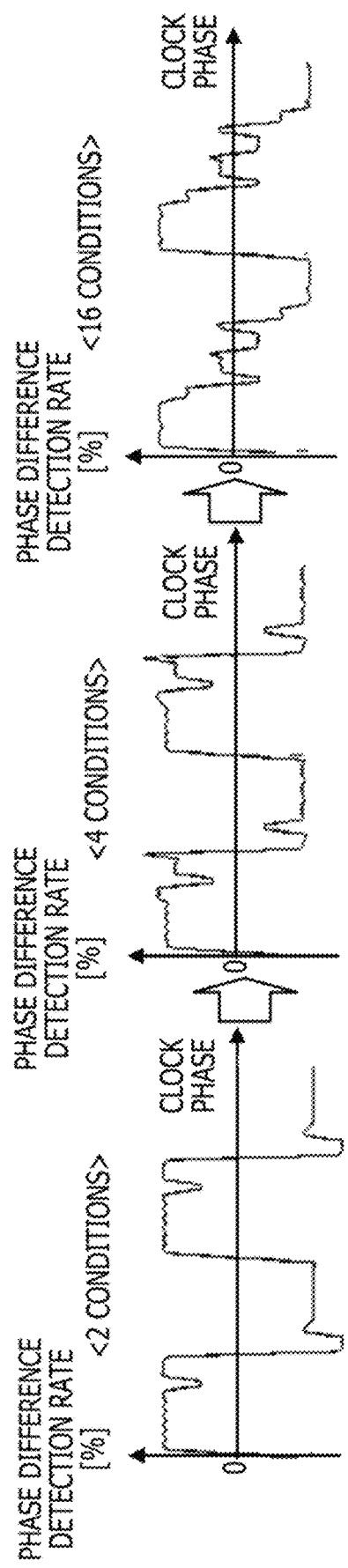
FIG. 17 is a diagram illustrating an example of switching of the phase difference detection conditions (after the sensitivity adjustment)

FIG. 16 and FIG. 17 are diagrams each illustrating an example of switching of the phase difference detection conditions.

FIG. 16 illustrates an example of the varying phase difference detection rate before the sensitivity adjustment by switching the phase difference detection conditions. FIG. 17 illustrates an example of the equivalently varying phase difference detection rate after the sensitivity adjustment by switching the phase difference detection conditions. The vertical axis represents the phase difference detection rate [%] and the horizontal axis represents the offset of the clock phase from the eye center in FIG. 16 and the clock phase in FIG. 17.

As illustrated in FIG. 16 and FIG. 17, the CDR circuit of the fourth embodiment switches the phase difference detection conditions to, for example, the 2 conditions, the 4 conditions, or the 16 conditions every time the CDR circuit determines that the phase adjusted value outputted by the filter 22i is fixed.

Figure 18:
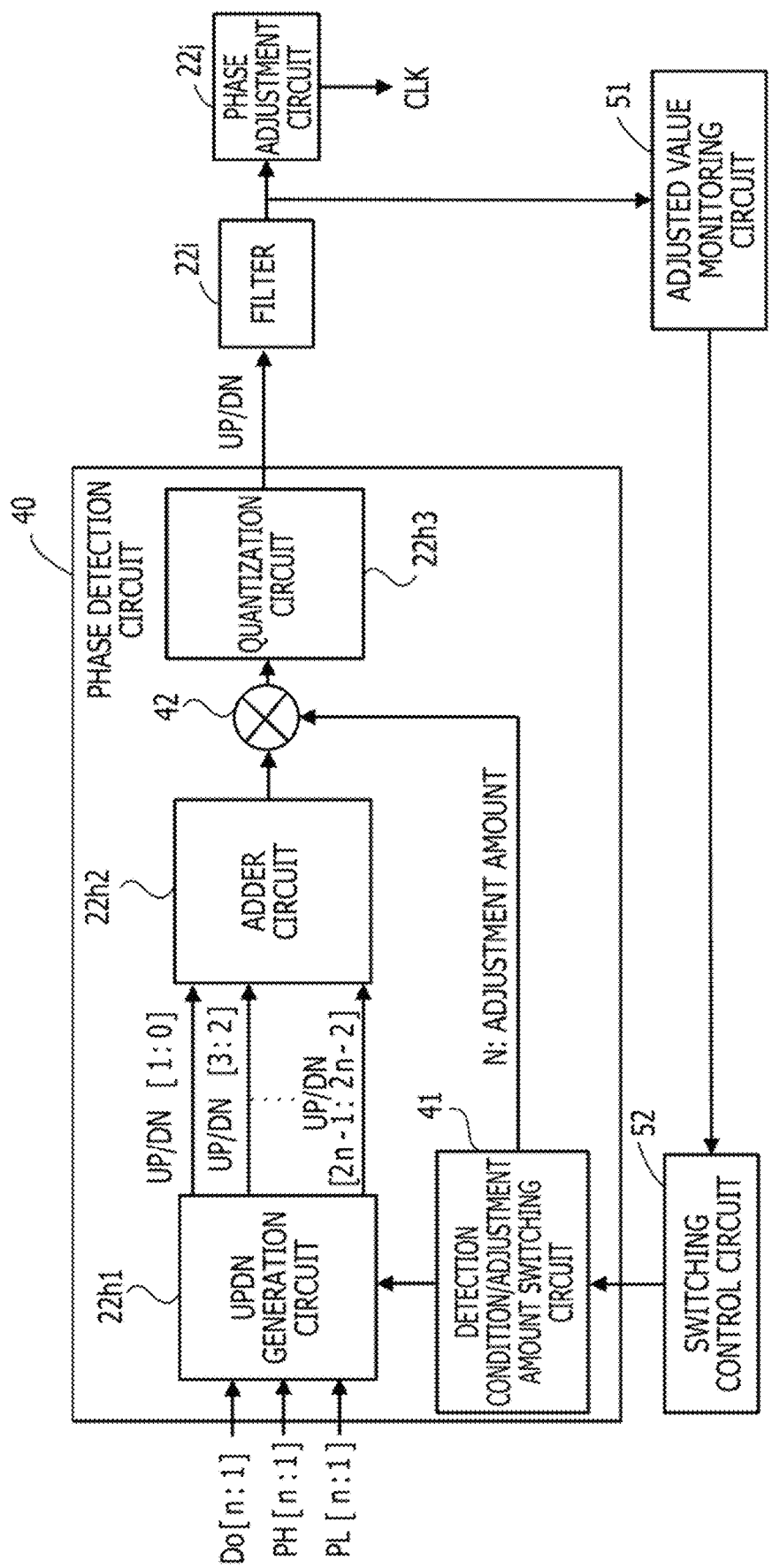
FIG. 18 is a diagram illustrating an example of a CDR circuit of a fourth embodiment.

FIG. 18 is a diagram illustrating an example of the CDR circuit of the fourth embodiment. In FIG. 18, the same elements as the elements illustrated in FIG. 10 or FIG. 13 are assigned with the same reference signs. The comparison circuits 22a to 22e, the decoder 22f, and the demultiplexer 22g illustrated in FIG. 10 are omitted and not illustrated.

A CDR circuit 50 of the fourth embodiment includes an adjusted value monitoring circuit 51 and a switching control circuit 52.

The adjusted value monitoring circuit 51 determines whether or not the phase adjusted value outputted by the filter 22i is fixed. The adjusted value monitoring circuit 51 outputs a signal indicating whether or not the phase adjusted value is fixed.

The switching control circuit 52 performs switching control of the phase difference detection conditions based on the signal outputted by the adjusted value monitoring circuit 51. If it is determined that the phase adjusted value is fixed, the switching control circuit 52 transmits to the detection condition/adjustment amount switching circuit 41 a signal instructing the detection condition/adjustment amount switching circuit 41 to change to a pattern with a larger number of the conditions (number of combinations) to be included than the pattern of the currently selected phase difference detection conditions.

Figure 19:
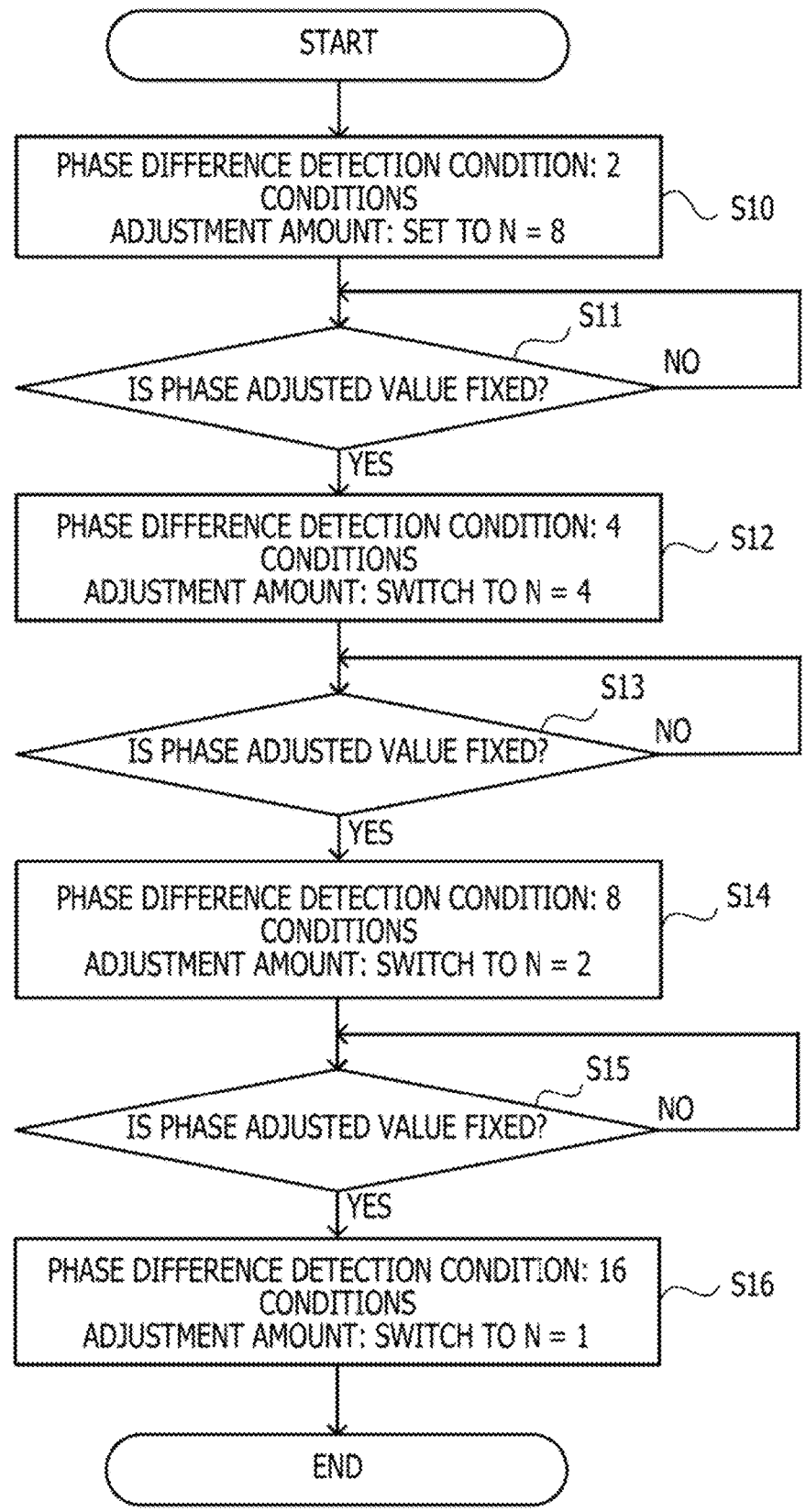
FIG. 19 is a flowchart illustrating flow of an example of a switching control operation of the phase difference detection conditions.

FIG. 19 is a flowchart illustrating flow of an example of a switching control operation of the phase difference detection conditions.

For example, when a receiver including the CDR circuit 50 is started, the switching control circuit 52 first transmits to the detection condition/adjustment amount switching circuit 41 a signal instructing the detection condition/adjustment amount switching circuit 41 to set the phase difference detection conditions to the 2 conditions as illustrated in FIG. 8. The detection condition/adjustment amount switching circuit 41 supplies to the UPDN generation circuit 22h1 a signal specifying the 2 conditions as the phase difference detection conditions to be adopted. The detection condition/adjustment amount switching circuit 41 outputs N=8 as the sensitivity adjustment amount N according to the phase difference detection conditions to be adopted. This sets the phase difference detection conditions to the 2 conditions and the adjustment amount to N=8 (step S10).

Subsequently, the adjusted value monitoring circuit 51 determines whether or not the phase adjusted value is fixed (step S11). If the adjusted value monitoring circuit 51 determines that the phase adjusted value is not fixed, processing of step S11 is repeated.

If the adjusted value monitoring circuit 51 determines that the phase adjusted value is fixed, the adjusted value monitoring circuit 51 outputs a signal indicating accordingly. With this, the switching control circuit 52 transmits to the detection condition/adjustment amount switching circuit 41 a signal instructing the detection condition/adjustment amount switching circuit 41 to set the phase difference detection conditions to the 4 conditions as illustrated in FIG. 1. The detection condition/adjustment amount switching circuit 41 supplies to the UPDN generation circuit 22h1 a signal specifying the 4 conditions as the phase difference detection conditions to be adopted. The detection condition/adjustment amount switching circuit 41 outputs N=4 as the sensitivity adjustment amount N according to the phase difference detection conditions to be adopted. This switches the phase difference detection conditions to the 4 conditions and the adjustment amount to N=4 (step S12).

Subsequently, the adjusted value monitoring circuit 51 determines again whether or not the phase adjusted value is fixed (step S13). If the adjusted value monitoring circuit 51 determines that the phase adjusted value is not fixed, processing of step S13 is repeated.

If the adjusted value monitoring circuit 51 determines that the phase adjusted value is fixed, the adjusted value monitoring circuit 51 outputs a signal indicating accordingly. With this, the switching control circuit 52 transmits to the detection condition/adjustment amount switching circuit 41 a signal instructing the detection condition/adjustment amount switching circuit 41 to set the phase difference detection conditions to the 8 conditions as illustrated in FIG. 6. The detection condition/adjustment amount switching circuit 41 supplies to the UPDN generation circuit 22h1 a signal specifying the 8 conditions as the phase difference detection conditions to be adopted. The detection condition/adjustment amount switching circuit 41 outputs N=2 as the sensitivity adjustment amount N according to the phase difference detection conditions to be adopted. This switches the phase difference detection conditions to the 8 conditions and the adjustment amount to N=2 (step S14).

Subsequently, the adjusted value monitoring circuit 51 determines again whether or not the phase adjusted value is fixed (step S15). If the adjusted value monitoring circuit 51 determines that the phase adjusted value is not fixed, processing of step S15 is repeated.

If the adjusted value monitoring circuit 51 determines that the phase adjusted value is fixed, the adjusted value monitoring circuit 51 outputs a signal indicating accordingly. With this, the switching control circuit 52 transmits to the detection condition/adjustment amount switching circuit 41 a signal instructing the detection condition/adjustment amount switching circuit 41 to set the phase difference detection conditions to the 16 conditions. The detection condition/adjustment amount switching circuit 41 supplies to the UPDN generation circuit 22h1 a signal specifying the 16 conditions as the phase difference detection conditions to be adopted. The detection condition/adjustment amount switching circuit 41 outputs N=1 as the sensitivity adjustment amount N according to the phase difference detection conditions to be adopted. This switches the phase difference detection conditions to the 16 conditions and the adjustment amount to N=1 (step S16). With the above, the switching control operation of the phase difference detection conditions ends.

The aforementioned processing is an example, and the phase difference detection conditions may be switched to the 16 conditions after switching from the 2 conditions to the 4 conditions, as illustrated in FIG. 16 and FIG. 17 or may be switched from the 2 condition to the 16 conditions.

Such a CDR circuit 50 may suppress the occurrence of the false lock by adopting the phase difference detection conditions including a smaller number of the conditions that generate the erroneous phase difference signal UP/DN if the phase adjusted value is not fixed. If the phase adjusted value is fixed, it is indicated that the clock phase is present not in the data transition part but in a part where the phase difference detection rate on sides of the eye center is fixed, as illustrated in FIG. 16, for example. Thus, even if a large number of the phase difference detection conditions are adopted, the false lock may be avoided. Use of the large number of phase difference detection conditions increases the actual phase difference detection rate, allowing for a stable lock operation.

Although in the above description, the example is described in which the phase detection circuit 40 having the sensitivity adjustment function is used, the aforementioned function to switch the phase difference detection conditions is also applicable to the phase detection circuit 22h illustrated in FIG. 11, which does not have the sensitivity adjustment function.

Fifth Embodiment

A CDR circuit of a fifth embodiment includes a function to avoid fluctuation of the clock phase resulting in the occurrence of the false lock, due to an environment-dependent factor, such as a temperature change.

Figure 20:
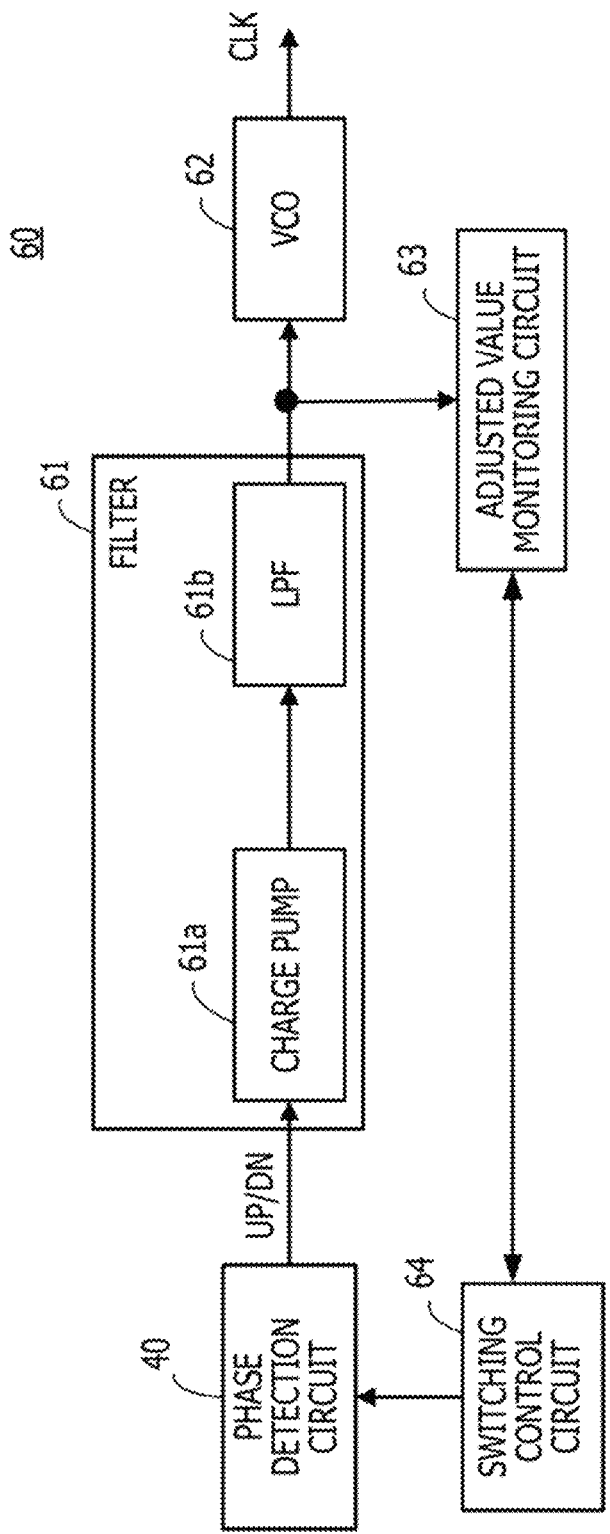
FIG. 20 is a diagram illustrating an example of a CDR circuit of a fifth embodiment.

FIG. 20 is a diagram illustrating an example of a CDR circuit of a fifth embodiment.

A CDR circuit 60 of the fifth embodiment includes the phase detection circuit 40, a filter 61, a VCO 62, an adjusted value monitoring circuit 63, and a switching control circuit 64. The comparison circuits 22a to 22e, the decoder 22f, and the demultiplexer 22g illustrated in FIG. 10 are omitted and not illustrated in FIG. 20.

The filter 61 has a charge pump 61a and a low-pass filter (denoted as LPF in FIG. 20) 61b. The charge pump 61a adjusts a current according to the phase difference signal UP/DN outputted by the phase detection circuit 40 and converts a current value to a voltage value. The low-pass filter 61b outputs a control voltage resulting from smoothing of that voltage.

The VCO 62 is an example of the phase adjustment circuit 22j and adjusts a phase or a frequency of the clock signal CLK based on a size of the control voltage.

The adjusted value monitoring circuit 63 monitors whether or not the aforementioned control voltage, which is an example of the phase adjusted value, is fixed (the control voltage falls within the predetermined threshold range for the predetermined period). The adjusted value monitoring circuit 63 outputs a signal indicating whether or not the control voltage is fixed. If the adjusted value monitoring circuit 63 determines that the control voltage is not fixed, and when the control voltage exceeds an upper limit of the threshold range, the adjusted value monitoring circuit 63 increases the upper limit and a lower limit of the threshold range, respectively, by a same value. If the adjusted value monitoring circuit 63 determines that the control voltage is not fixed, and when the control voltage falls below the lower limit of the threshold range, the adjusted value monitoring circuit 63 decreases the upper limit and the lower limit of the threshold range, respectively, by a same value. With this, the adjusted value monitoring circuit 63 changes the threshold range so that the control voltage is included in the threshold range.

The switching control circuit 64 performs the switching control of the phase difference detection conditions based on a signal outputted by the adjusted value monitoring circuit 63. If the adjusted value monitoring circuit 63 outputs a signal indicating that the phase adjusted value is fixed, the switching control circuit 64 transmits to the phase detection circuit 40 a signal instructing the phase detection circuit 40 to change the phase difference detection condition to a larger number of conditions.

Figure 21:
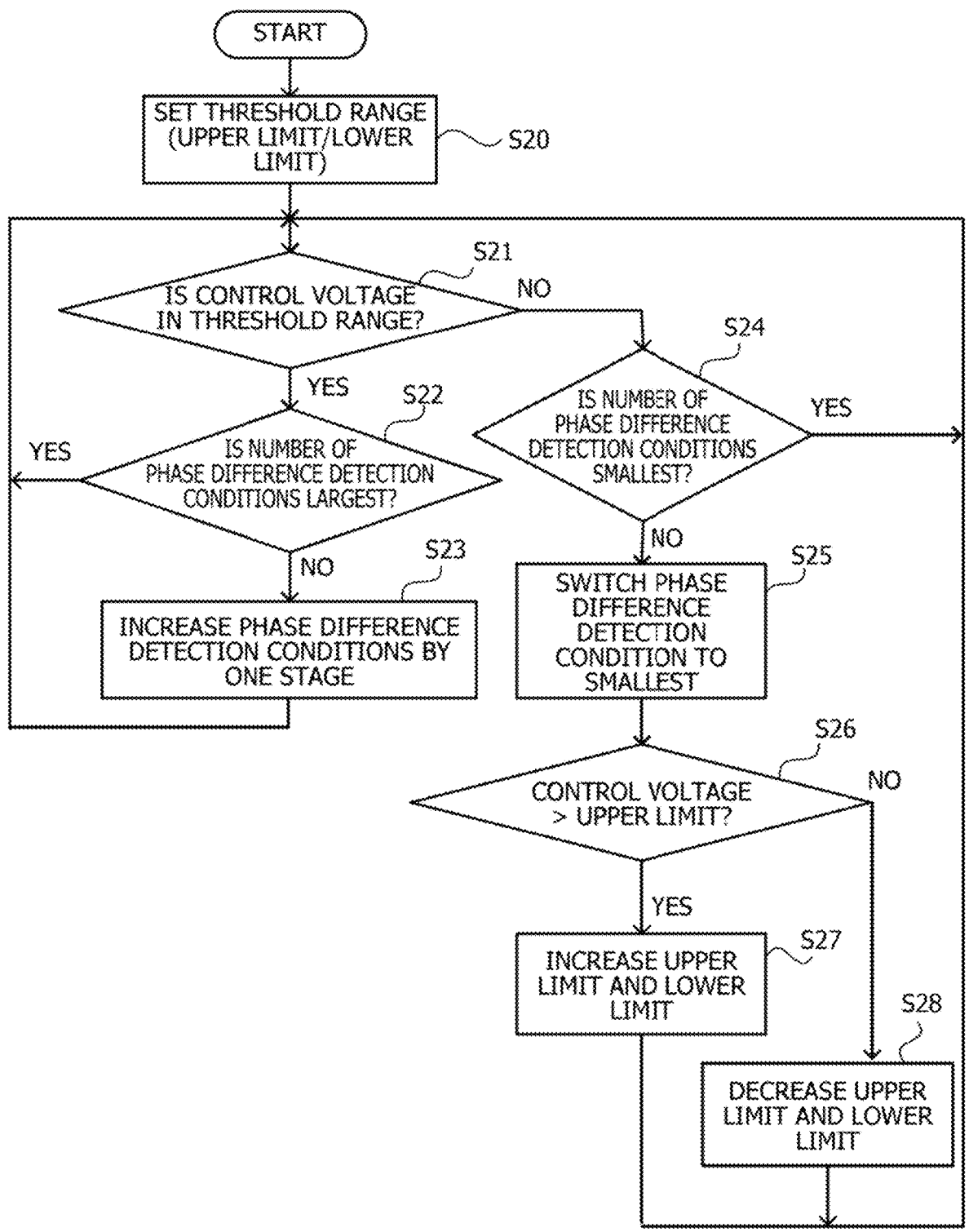
FIG. 21 is a flowchart illustrating flow of an example of a switching control and threshold range adjustment operation of the phase difference detection conditions.

FIG. 21 is a flowchart illustrating flow of an example of a switching control and threshold range adjustment operation of the phase difference detection conditions.

First, the adjusted value monitoring circuit 63 sets the upper limit and the lower limit of the threshold range (step S20). The upper limit and lower limit are stored in the unillustrated memory (which may be the register or the like) in the adjusted value monitoring circuit 63. Initial values of the upper limit and lower limit may be stored in the memory in advance or may be supplied from outside of the CDR circuit 60.

Subsequently, the adjusted value monitoring circuit 63 determines whether or not the control voltage is in the threshold range for the predetermined period (step S21). If the adjusted value monitoring circuit 63 determines that the control voltage is in the threshold range for the predetermined period, the switching control circuit 64 determines whether or not the number of the current phase difference detection conditions is largest (16 conditions, for example) (step S22). If the switching control circuit 64 determines that the number of the current phase difference detection conditions is not largest, the switching control circuit 64 transmits to the phase detection circuit 40 a signal instructing the phase detection circuit 40 to change the phase difference detection conditions to conditions in one stage higher. This increases the phase difference detection conditions by one stage (step S23).

If it is determined after processing of step S23 or in processing of step S22 that the number of the phase difference detection conditions is largest, processing is repeated from step S21.

In the processing of step S21, if the adjusted value monitoring circuit 63 determines that the control voltage is not in the threshold range for the predetermined period, the switching control circuit 64 determines whether or not the number of the current phase difference detection conditions is smallest (the 2 conditions, for example) (step S24).

If the switching control circuit 64 determines that the number of the current phase difference detection conditions is not smallest, the switching control circuit 64 transmits to the phase detection circuit 40 a signal instructing the phase detection circuit 40 to change to the smallest number of the phase difference detection conditions. This switches the phase difference detection conditions to the smallest number of the conditions (step S25).

If the adjusted value monitoring circuit 63 determines that the control voltage is not in the threshold range, the adjusted value monitoring circuit 63 determines whether or not the control voltage exceeds the upper limit (step S26).

If the adjusted value monitoring circuit 63 determines that the control voltage exceeds the upper limit, the adjusted value monitoring circuit 63 increases the upper limit and lower limit (step S27). If the adjusted value monitoring circuit 63 determines that the control value does not exceed the upper limit, the adjusted value monitoring circuit 63 decreases the upper limit and lower limit (step S28). A fluctuation amount of the upper limit and lower limit is predetermined according to an amount of change of the control voltage due to the temperature change, for example. The fluctuation amount of the upper limit and lower limit is stored in advance in, for example, the unillustrated memory (which may be the register or the like) in the adjusted value monitoring circuit 63.

If it is determined after processing of step S27 and S28 or in processing of step S24 that the number of the current phase difference detection conditions is smallest, the processing is repeated from step S21.

The order of the aforementioned processes is an example and may be changed.

Figure 22:
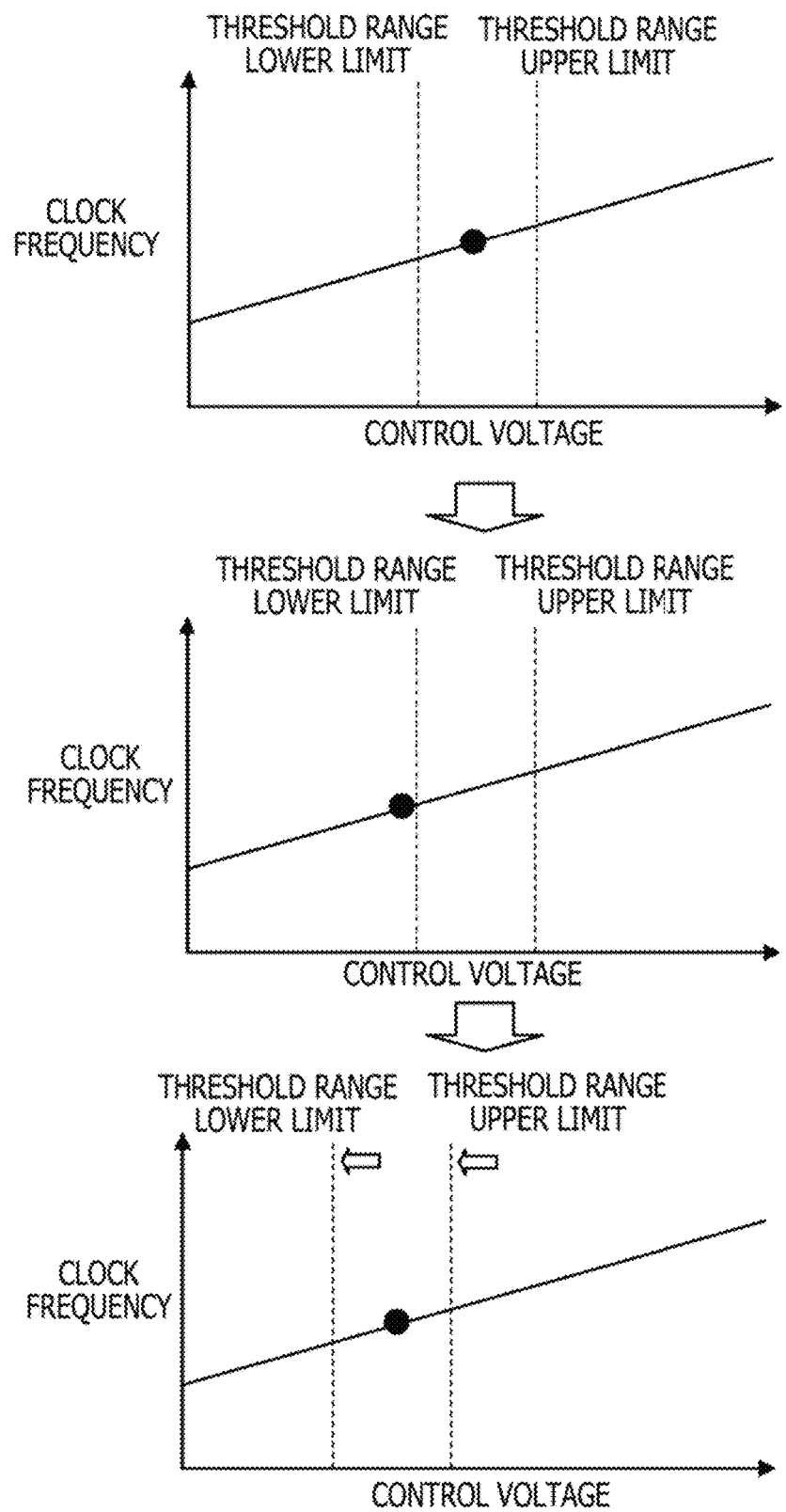
FIG. 22 is a diagram illustrating a control example of a threshold range.

FIG. 22 is a diagram illustrating a control example of the threshold range. In FIG. 22, the vertical axis represents the clock frequency and the horizontal axis represents the control voltage.

When the clock frequency varies due to the temperature change from a state in which the control voltage is in the threshold range and the control voltage falls below the lower limit, the number of the phase difference detection conditions becomes smallest, and, as illustrated in FIG. 22, the upper limit and lower limit decrease and the control voltage falls within the threshold range. If this state continues, the phase difference detection conditions switch to the larger number of conditions.

If the clock frequency fluctuates due to the environment-dependent factor such as the temperature change, the clock phase also fluctuates, which is likely to cause the false lock. The CDR circuit 60 of the fifth embodiment as described above detects whether or not such fluctuation of the clock phase occurs, based on whether or not the control voltage is in the threshold range. If the control voltage is out of the threshold range, it is likely that the fluctuation of the clock phase occurs due to the environment-dependent factor. Therefore, the CDR circuit 60 switches the phase difference detection conditions to the smallest number of conditions that are less likely to cause the false lock. This makes it possible to suppress the occurrence of the false lock due to the environment-dependent factor.

If the control voltage is out of the threshold range, the CDR circuit 60 changes the threshold range, and switches the phase difference detection conditions to the larger number of conditions as far as the control voltage is in that threshold range. This makes it possible to increase the phase difference detection rate while suppressing the occurrence of the false lock, in an environment after the change.

Sixth Embodiment

In the aforementioned description, the correct lock point is the point where "UPDN" is 0% and the change from negative to positive occurs, as illustrated in FIG. 5, or the like, for example. This is because this point is located at the eye center of the eye pattern in each of the aforementioned examples.

However, there is a case in which the point where "UPDN" is 0% and the change from negative to positive occurs is not located at the eye center.

Figure 23:
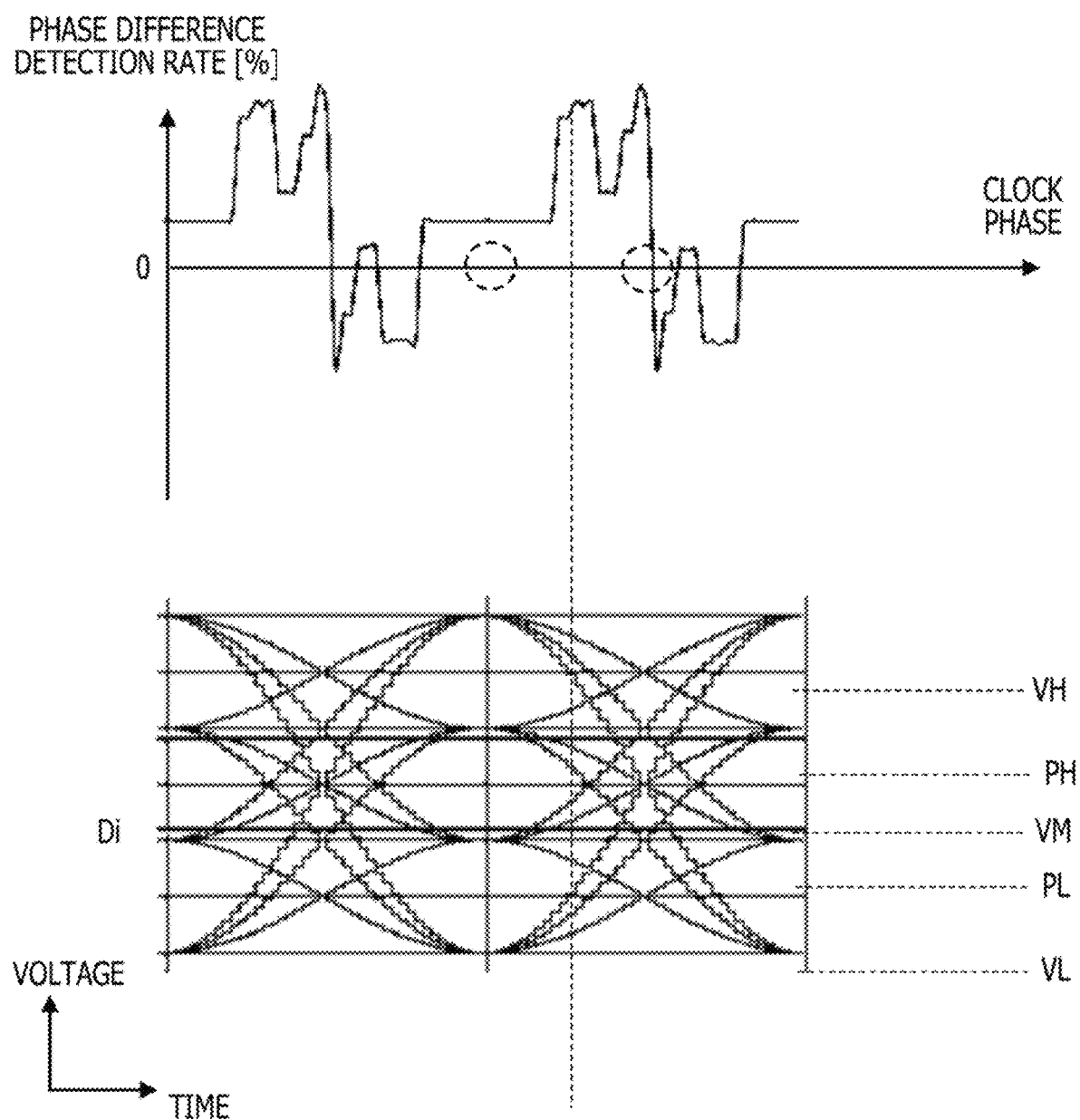
FIG. 23 is a diagram illustrating an example in which a lock point is not located at an eye center (No. 1)
Figure 24:
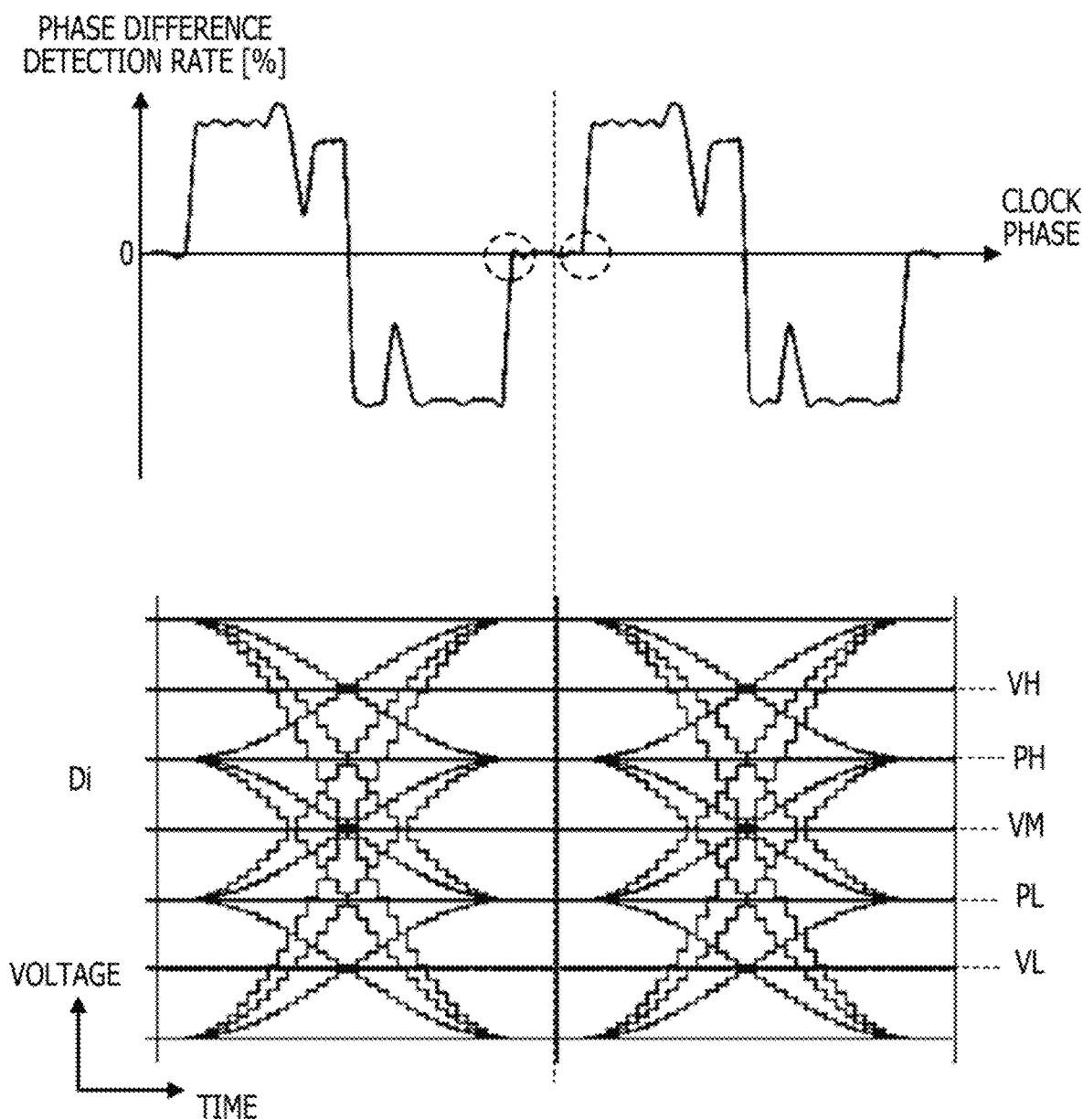
FIG. 24 is a diagram illustrating an example in which the lock point is not located at the eye center (No. 2)
Figure 25:
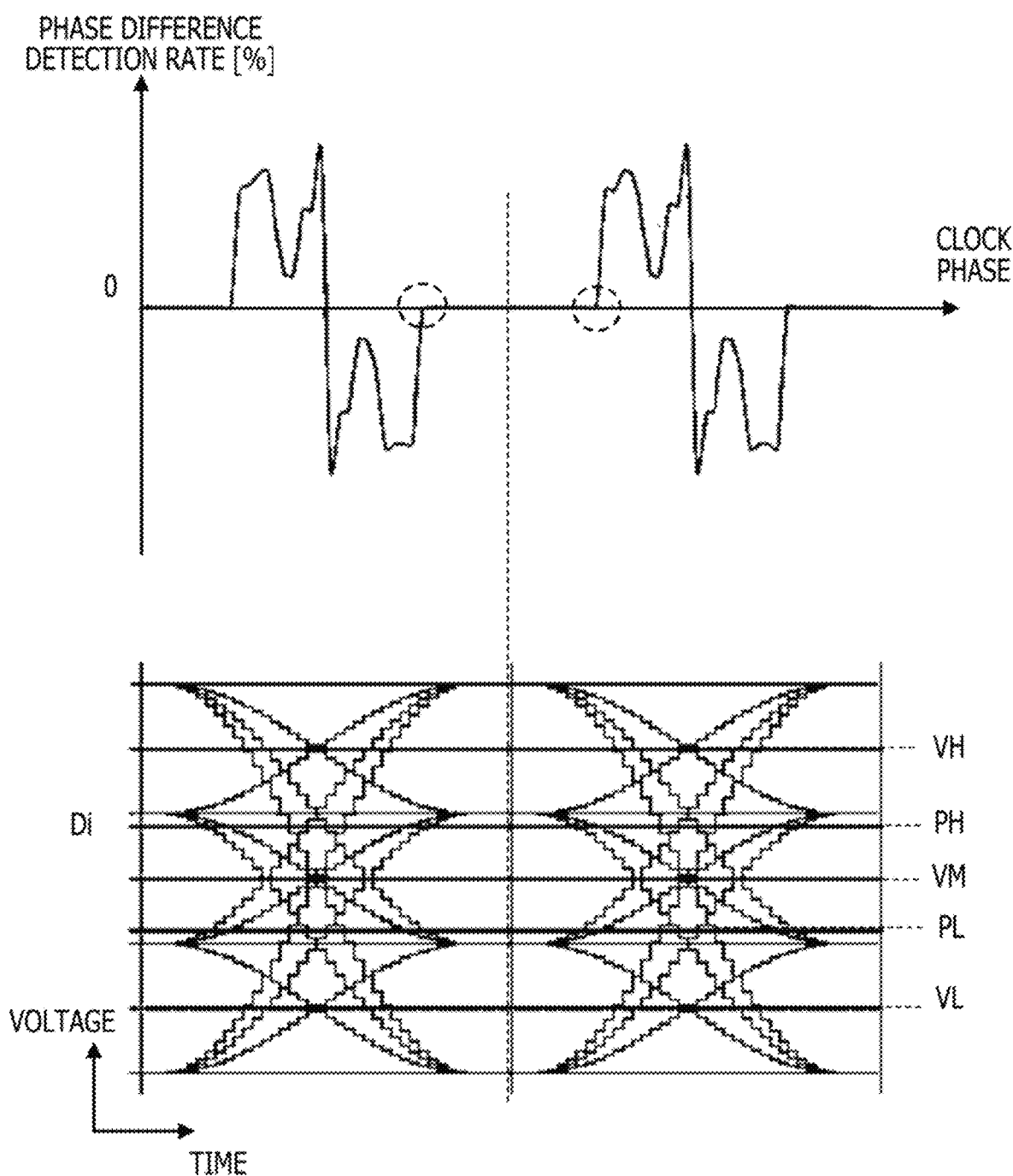
FIG. 25 is a diagram illustrating an example in which the lock point is not located at the eye center (No. 3)

FIG. 23, FIG. 24, and FIG. 25 are each a diagram illustrating an example in which the lock point is not located at the eye center. The upper part of each of FIG. 23 to FIG. 25 represents the equivalent phase difference detection rate after the sensitivity adjustment when the phase difference detection conditions are set to the 4 conditions. The vertical axis represents the phase difference detection rate [%] and the horizontal axis represents the clock phase. In the lower part of each of FIG. 23 to FIG. 25, all the transitions of the data signal Di of PAM4 are denoted by the eye patterns. The vertical axis represents a voltage and the horizontal axis represents time.

The phase difference detection rate in FIG. 23 to FIG. 25 differs from the equivalent phase difference detection rate after the sensitivity adjustment illustrated in FIG. 15, due to a deviation in the thresholds PH and PL for phase difference determination or a difference in rising speed and falling speed of the data signal Di.

In the example of FIG. 23, the thresholds PH and PL deviate to side of the threshold VM, compared with the example illustrated in FIG. 15. Consequently, in the example of FIG. 23, the phase difference detection rate around the eye center is 0%, and the clock phase is not locked and in an unstable state, around the eye center (between the 2 points surrounded by the dot line).

In the example of FIG. 24, the rising speed and the falling speed of the data signal Di are faster, compared with the example illustrated in FIG. 15. Even in such a case, the phase difference detection rate around the eye center is 0%, and the clock phase is not locked and in the unstable state, around the eye center (between the 2 points surrounded by the dot line). If the thresholds PH and PL deviate to side of the threshold VM as illustrated in FIG. 25, the area around the eye center where the phase difference detection rate is 0% expands.

Thus, a CDR circuit of a sixth embodiment to be illustrated below has a function to set the lock point to the left or right side of an eye opening and not at the eye center, and suppress the aforementioned unstable state.

Figure 26:
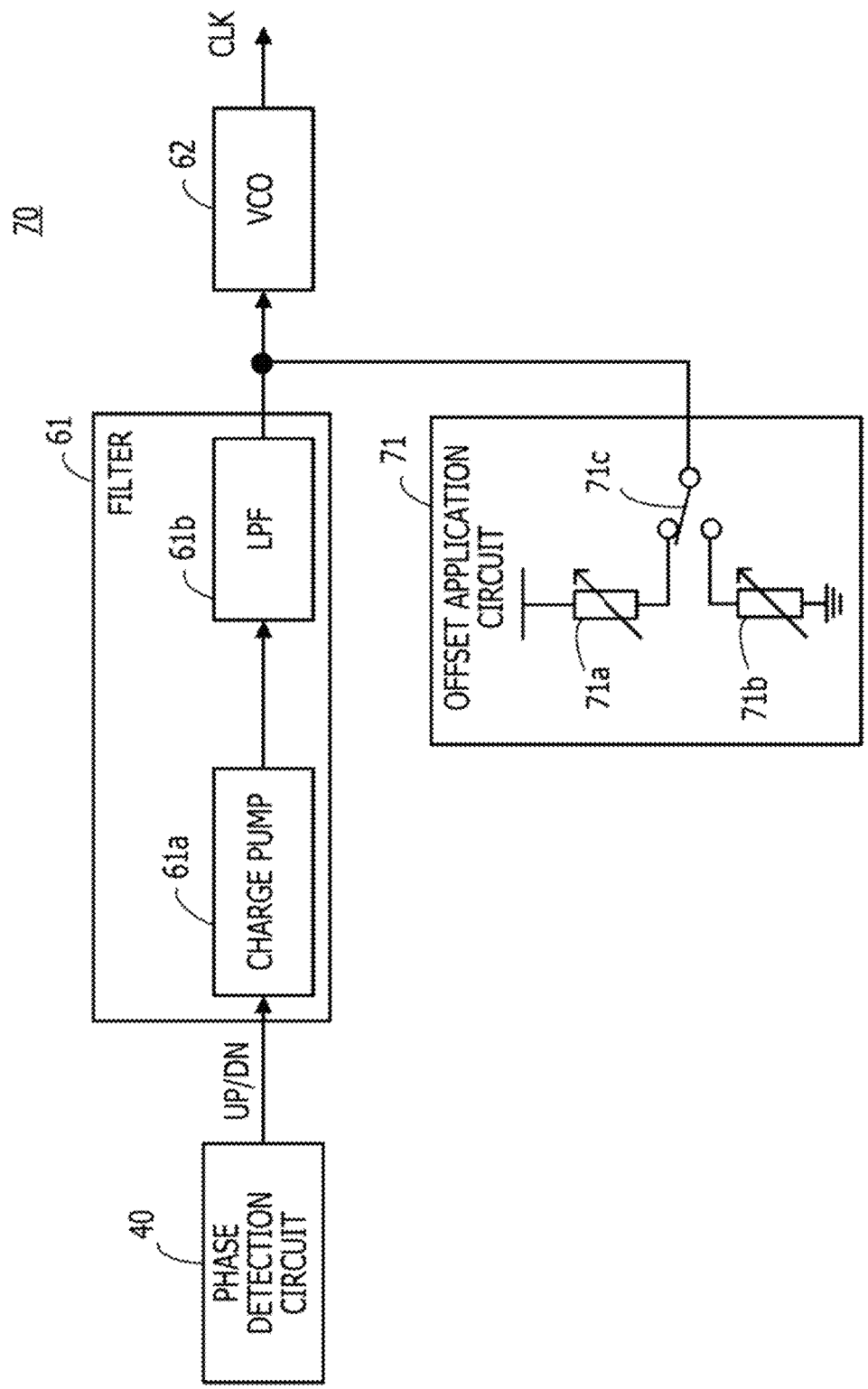
FIG. 26 is a diagram illustrating an example of a CDR circuit of a sixth embodiment.

FIG. 26 is a diagram illustrating an example of the CDR circuit of the sixth embodiment. In FIG. 26, the same elements as the elements illustrated in FIG. 20 are assigned with the same reference signs. The comparison circuits 22a to 22e, the decoder 22f, and the demultiplexer 22g illustrated in FIG. 10 are omitted and not illustrated in FIG. 26.

A CDR circuit 70 of the sixth embodiment includes an offset application circuit 71. The offset application circuit 71 has variable resistive elements 71a and 71b, and a switch 71c.

The variable resistive element 71a is coupled between a power supply and the switch 71c. The variable resistive element 71b is coupled between a ground and the switch 71c. One end of the switch 71c is coupled to a wire that couples the filter 61 and the VCO 62, and the other end of the switch 71c is coupled to one of the variable resistive elements 71a and 71b.

A control signal that controls resistance values of the variable resistive elements 71a and 71b or a control signal of the switch 71c is supplied from an unillustrated control circuit.

In such a CDR circuit 70, if the lock point is shifted from the eye center to the left of the eye opening, the switch 71c electrically couples the variable resistive element 71a on side of the power supply to the aforementioned wire. This adds a positive offset value to the phase adjusted value (control voltage).

In contrast, in the CDR circuit 70, if the lock point is shifted from the eye center to the right of the eye opening, the switch 71c electrically couples the variable resistive element 71b on side of the ground to the aforementioned wire. This adds a negative offset value to the phase adjusted value (control voltage).

An amount of the shift of the lock point from the eye center is determined based on the resistance values of the variable resistive element 71a and 71b. To deter the occurrence of the false lock, the resistance values of the variable resistive elements 71a and 71b are controlled so that the lock point is not too close to the data transition part of the data signal Di.

Figure 27:
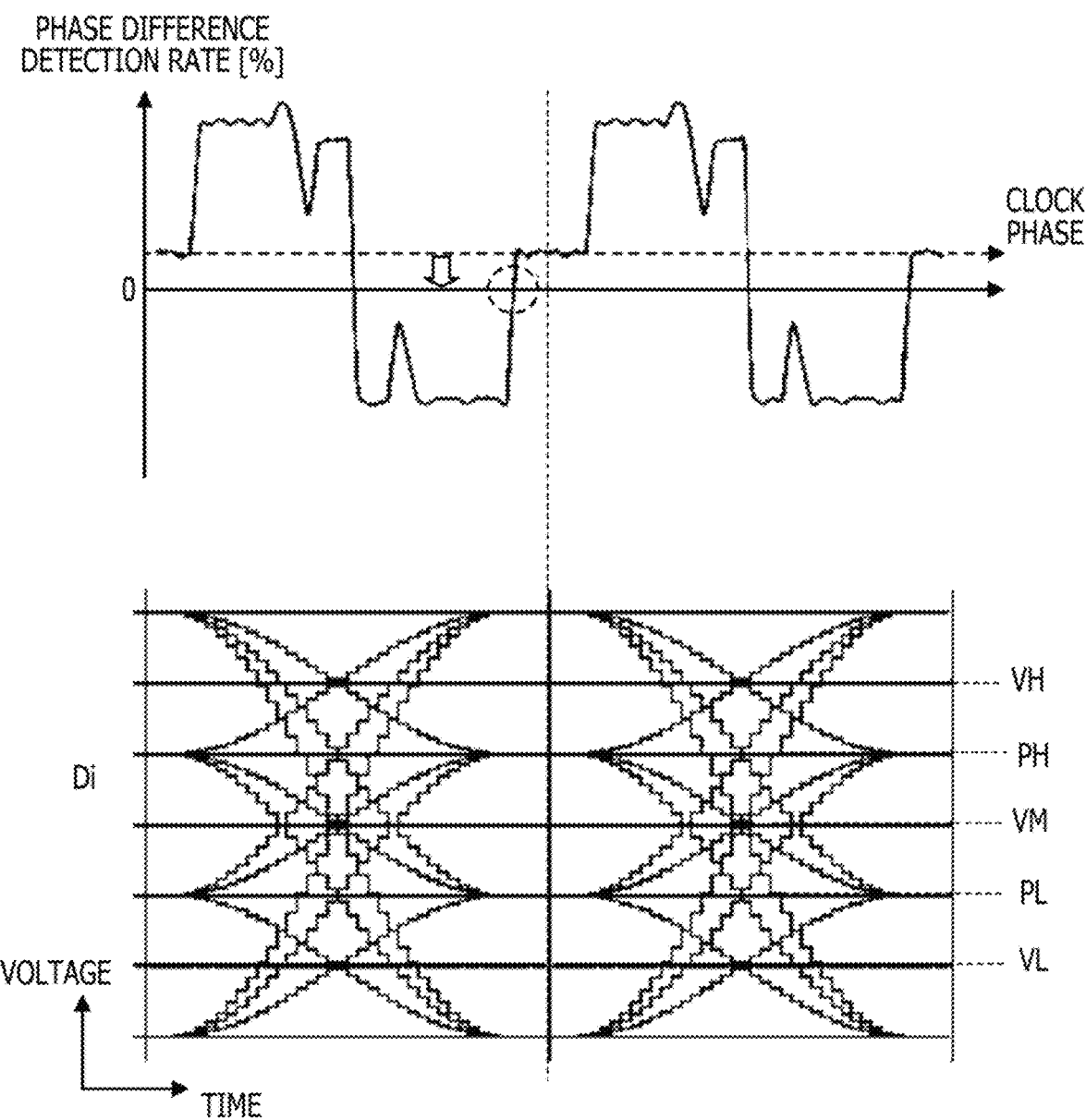
FIG. 27 is a diagram illustrating an example of the lock point to be determined by offset application.

FIG. 27 is a diagram illustrating an example of the lock point to be determined by offset application. The upper part of FIG. 27 represents the equivalent phase difference detection rate after the sensitivity adjustment and the offset application when the phase difference detection conditions are set to the 4 conditions. The vertical axis represents the phase difference detection rate [%] and the horizontal axis represents the clock phase. In the lower part of FIG. 27, all the transitions of the data signal Di of PAM4 are denoted by the eye patterns. The vertical axis represents a voltage and the horizontal axis represents time.

In FIG. 27, the phase difference detection characteristic is such that the horizontal axis of the phase difference detection rate=0% falls with respect to the phase difference detection characteristic as illustrated in FIG. 25. Consequently, a point where the phase difference detection rate changes from negative to positive (point surrounded by the dot line) is obtained at a position to the left of the eye opening and not at the eye center, and this point is the lock point.

FIG. 27 illustrates an example of the lock point to be obtained when the switch 71c electrically couples the variable resistive element 71a on the side of the power supply and the aforementioned wire. If the switch 71c electrically couples the variable resistive element 71a on side of the power supply and the aforementioned wire according to the resistance value of the variable resistive elements, the phase difference detection characteristic is such that the horizontal axis of the phase difference detection rate=0% rises with the respect to the phase difference detection characteristic as illustrated in FIG. 25. Consequently, the point where the phase difference detection rate changes from negative to positive (point surrounded by the dot line) is obtained at a position to the right of the eye opening and not at the eye center, and this point is the lock point.

According to the CDR circuit 70 as described above, the unstable lock operation is suppressed and the follow-up performance of the phase detection circuit 40 is improved.

Simulation Example

Figure 28:
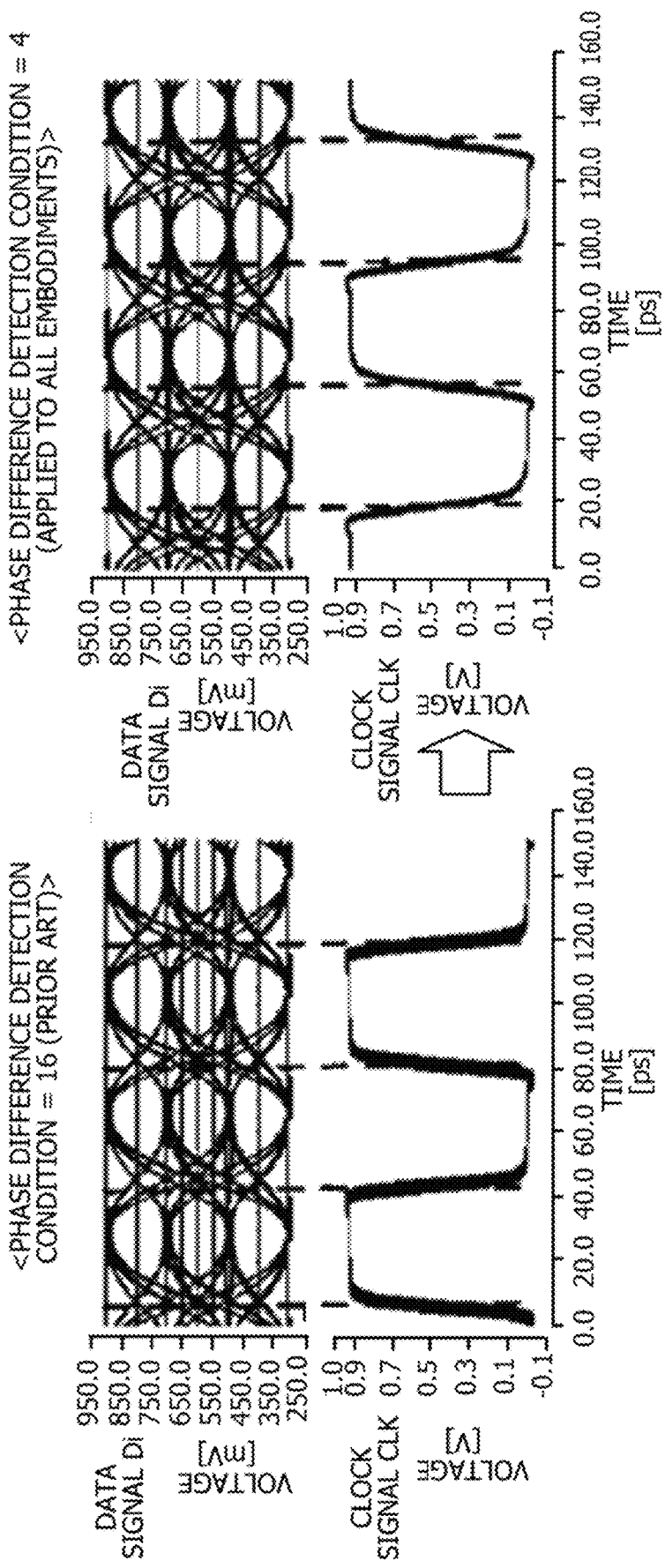
FIG. 28 is a diagram illustrating an example of a simulation result of a lock operation.

FIG. 28 is a diagram illustrating an example of a simulation result of a lock operation. For comparison, FIG. 28 also illustrates the simulation result when the traditional CDR circuit that does not narrow the phase difference detection conditions (phase difference detection conditions=16) is used. In the upper part of FIG. 28, all the transitions of the data signal Di of PAM4 are denoted by the eye patterns. The vertical axis represents the voltage V [mV], and the horizontal axis represents the time [ps]. In the lower part of FIG. 28 is illustrated the clock signal CLK. The vertical axis represents the voltage V [V], and the horizontal axis represents the time [ps].

If the phase difference detection conditions are not narrowed, in the example of FIG. 28, the clock phase is located in the data transition part of the data signal Di and the false lock occurs. In contrast, if the phase difference detection conditions are narrowed to the 4 conditions, as illustrated in FIG. 1, for example, and the functions of the aforementioned embodiments are applied, the clock phase is located to the left of an opening part of the data signal Di and the lock operation is performed correctly, as illustrated in FIG. 28.

It is possible to combine all of the functions of the respective embodiments described above. The offset application circuit 71 of the CDR circuit 70 of the sixth embodiment may be combined with the traditional CDR circuit that does not narrow the phase difference detection conditions.

As discussed above, one aspect of the CDR circuit and the receiver of the multilevel modulation method has been described in accordance with the embodiments, such an aspect is a mere example and not limited to the above description.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A clock data recovery (CDR) circuit comprising:
a data determination circuit that receives a data signal for which each of a plurality of potential levels is associated with a value of 2 bits or more, the potential levels being separated by 3 or more first thresholds, and outputs a result of determination that determines a value of the data signal, based on a result of a first comparison that compares the 3 or more first thresholds with the data signal at timing synchronized with a clock signal;
a comparison circuit that outputs a result of a second comparison that compares the data signal with a second threshold at the timing;
a phase detection circuit that generates a phase difference signal indicating whether to advance or delay a phase of the clock signal, based on the result of the determination and the result of the second comparison, when a value of 3 consecutive symbols represents one data pattern that transits like a slope and when a combination of the value of the 3 symbols and the result of the second comparison at an intermediate symbol of the 3 symbols matches some prespecified combination of a plurality of combinations that the data pattern and the result of the second comparison at the intermediate symbol may take;
a filter that generates a phase adjusted value indicating an adjustment amount of the phase, based on the phase difference signal; and
a phase adjustment circuit that adjusts the phase based on the phase adjusted value.

2. The CDR circuit according to claim 1, wherein
the some combination is a combination that is less likely to generate an erroneous phase difference signal than any combination other than the some combination, of the plurality of combinations.

3. The CDR circuit according to claim 1, wherein
the phase detection circuit calculates a product of a result of addition that adds the generated phase difference signal to each of a plurality of pairs of the 3 symbols included in n (n≥4) consecutive symbols of the data signal, and a value obtained by dividing the number of the plurality of combinations by the number of the some combination, and
the filter generates the phase adjusted value based on the product.

4. The CDR circuit according to claim 1, wherein
there is a plurality of patterns of the some combination, according to a difference in the number of combinations to be included, and a pattern with a smaller number of combinations to be included has a fewer combinations that become a factor to generate the erroneous phase difference signal, and
the phase detection circuit selects a pattern of the plurality of patterns.

5. The CDR circuit according to claim 4, further comprising:
an adjusted value monitoring circuit that determines whether or not the phase adjusted value is fixed; and
a switching control circuit that instructs the phase detection circuit to select a pattern with a larger number of combinations to be included than a currently selected pattern, of the plurality of patterns, if the adjusted value monitoring circuit determines that the phase adjusted value is fixed.

6. The CDR circuit according to claim 5, wherein
the adjusted value monitoring circuit determines whether or not the phase adjusted value falls within a predetermined threshold range,
the switching control circuit instructs the phase detection circuit to select a pattern with the smallest number of combinations to be included, of the plurality of patterns, if the adjusted value monitoring circuit determines that the phase adjusted value does not fall within the threshold range, and
the adjusted value monitoring circuit changes the threshold range so as to include the phase adjusted value, if the adjusted value monitoring circuit determines that the phase adjusted value does not fall within the threshold range.

7. The CDR circuit according to claim 1, further comprising:
an offset application circuit that adds a positive or negative offset value to the phase adjusted value.

8. A receiver of a multilevel modulation method comprising:
an equalizing circuit that receives a first data signal for which each of a plurality of potential levels is associated with a value of 2 bits or more, the potential levels being separated by 3 or more first thresholds, performs equalization processing on the first data signal, and outputs a second data signal;
a data determination circuit that receives the second data signal and outputs a result of determination that determines a value of the second data signal, based on a result of a first comparison that compares the 3 or more first thresholds with the second data signal at timing synchronized with a clock signal;
a comparison circuit that outputs a result of a second comparison that compares the second data signal with a second threshold at the timing;
a phase detection circuit that generates a phase difference signal indicating whether to advance or delay a phase of the clock signal, based on the result of the determination and the result of the second comparison, when a value of 3 consecutive symbols represents one data pattern that transits like a slope and when a combination of the value of the 3 symbols and the result of the second comparison at an intermediate symbol of the 3 symbols matches some prespecified combination of a plurality of combinations that the data pattern and the result of the second comparison at the intermediate symbol may take;
a filter that generates a phase adjusted value indicating an adjustment amount of the phase, based on the phase difference signal; and
a phase adjustment circuit that adjusts the phase based on the phase adjusted value.

\* \* \* \* \*